(12) United States Patent
Yeh et al.

(10) Patent No.: US 12,400,989 B2
(45) Date of Patent: Aug. 26, 2025

(54) ARRANGEMENT OF POWER-GROUNDS IN PACKAGE STRUCTURES

(71) Applicant: Taiwan Semiconductor Manufacturing Co., Ltd., Hsinchu (TW)

(72) Inventors: Ting-Yu Yeh, Hsinchu (TW); Chun-Hua Chang, Zhubei (TW); Fong-Yuan Chang, Hsinchu (TW); Jyh Chwen Frank Lee, Palo Alto, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/428,934

(22) Filed: Jan. 31, 2024

(65) Prior Publication Data
US 2024/0178177 A1 May 30, 2024

Related U.S. Application Data

(62) Division of application No. 17/394,213, filed on Aug. 4, 2021, now Pat. No. 11,929,340.

(60) Provisional application No. 63/139,940, filed on Jan. 21, 2021.

(51) Int. Cl.
*H01L 23/00* (2006.01)
*H01L 21/56* (2006.01)

(52) U.S. Cl.
CPC .............. *H01L 24/20* (2013.01); *H01L 24/19* (2013.01); *H01L 21/568* (2013.01); *H01L 24/13* (2013.01); *H01L 2224/13024* (2013.01); *H01L 2224/19* (2013.01); *H01L 2224/221* (2013.01)

(58) Field of Classification Search
CPC ... H01L 2224/0401; H01L 2224/13024; H01L 2224/96; H01L 2224/19; H01L 2224/221; H01L 2224/18; H01L 23/3128; H01L 23/5286; H01L 23/3107; H01L 23/3171; H01L 23/525
See application file for complete search history.

(56) References Cited

U.S. PATENT DOCUMENTS

| | | | |
|---|---|---|---|
| 8,549,460 B2 | 10/2013 | Law et al. |
| 10,103,124 B2 | 10/2018 | Kawaminami |
| 10,796,980 B2 | 10/2020 | Yokoyama |
| 10,886,224 B2 | 1/2021 | Gerousis et al. |
| 10,957,662 B2 | 3/2021 | Wu |
| 10,957,679 B2 | 3/2021 | Lee et al. |

(Continued)

FOREIGN PATENT DOCUMENTS

| | | | |
|---|---|---|---|
| CN | 107799493 A | 3/2018 |
| DE | 112021000867 T5 | 12/2022 |

(Continued)

*Primary Examiner* — Marlon T Fletcher
*Assistant Examiner* — Christina A Sylvia
(74) *Attorney, Agent, or Firm* — Slater Matsil, LLP

(57) ABSTRACT

A structure includes a redistribution structure, which includes a bottom layer and a plurality of upper layers over the bottom layer. The redistribution structure also includes a power-ground macro extending from a topmost layer in the plurality of upper layers to a bottommost layer in the plurality of upper layers, and a metal pad in the bottom layer and overlapped by the power-ground macro. The metal pad is electrically disconnected from the power-ground macro.

20 Claims, 18 Drawing Sheets

(56) References Cited

U.S. PATENT DOCUMENTS

| | | |
|---|---|---|
| 11,101,209 B2 | 8/2021 | Liu et al. |
| 11,309,246 B2 | 4/2022 | Dabral et al. |
| 2008/0098340 A1 | 4/2008 | Oh |
| 2011/0260318 A1 | 10/2011 | Eisenstadt |
| 2014/0110856 A1* | 4/2014 | Lin .................. H01L 23/49833 |
| | | 257/774 |
| 2016/0155692 A1 | 6/2016 | Dosluoglu |
| 2017/0063079 A1 | 3/2017 | Gu et al. |
| 2019/0157233 A1* | 5/2019 | Fillion .................... H01L 24/20 |
| 2021/0018773 A1 | 1/2021 | Woodgate et al. |
| 2021/0202391 A1 | 7/2021 | Chun et al. |
| 2021/0391270 A1* | 12/2021 | Chun ...................... H01L 24/18 |
| 2022/0367210 A1* | 11/2022 | Lin ..................... H01L 21/4882 |

FOREIGN PATENT DOCUMENTS

| | | |
|---|---|---|
| JP | 2019176008 A | 10/2019 |
| KR | 20110004280 A | 1/2011 |
| KR | 20200135151 A | 12/2020 |
| TW | 201915624 A | 4/2019 |

\* cited by examiner

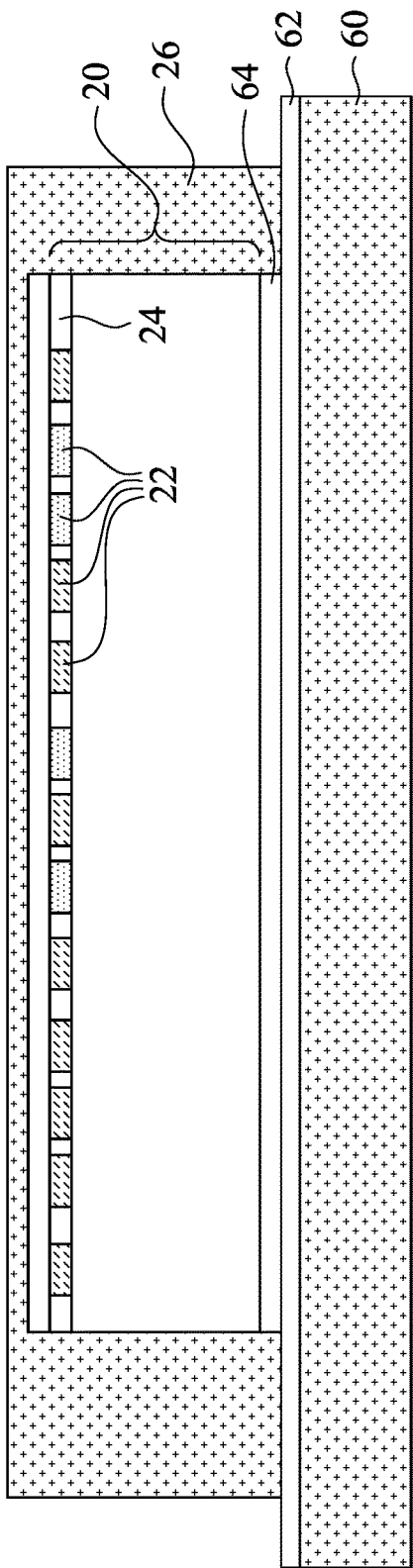
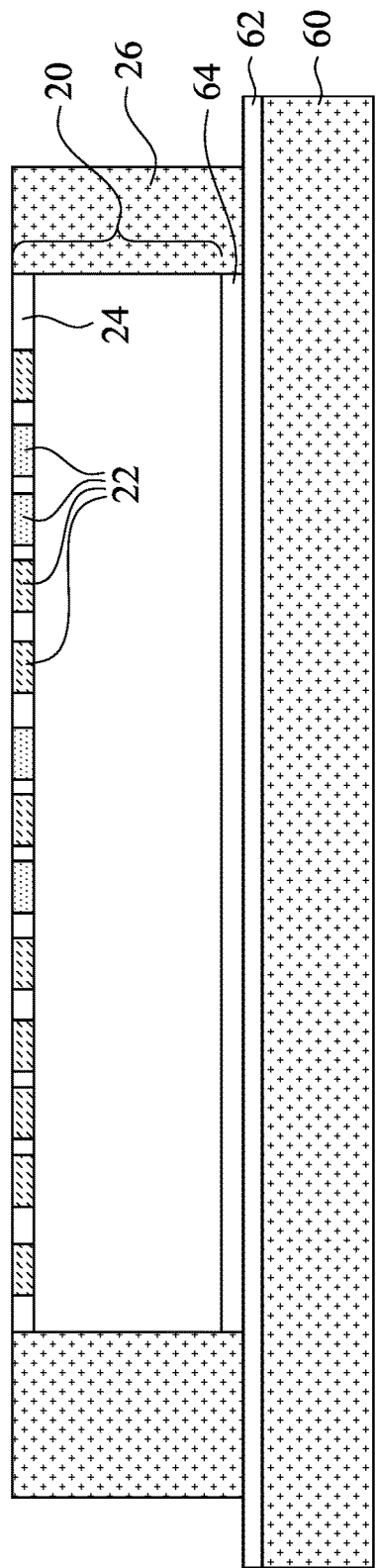
FIG. 8C
FIG. 8D

ARRANGEMENT OF POWER-GROUNDS IN PACKAGE STRUCTURES

PRIORITY CLAIM AND CROSS-REFERENCE

This application is a divisional of U.S. patent application Ser. No. 17/394,213, filed on Aug. 4, 2021, and entitled "Arrangement of Power-Grounds in Package Structures," which claims the benefit of U.S. Provisional Application No. 63/139,940, filed on Jan. 21, 2021, and entitled "Arrangement of Power Grounds in Package Structures," which applications are hereby incorporated herein by reference.

BACKGROUND

In the manufacturing of integrated circuit components, power and ground (VDD and VSS) networks are designed along with the design of signal lines. The power and ground networks may include pre-designed macros (standard cells), which are picked & placed to desirable locations of the layouts of the integrated circuit components. The macros, when providing convenience and efficiency, also sacrificed the flexibility of the design. For example, when designing a layout of a redistribution structure of an Integrated Fan-Out (InFO) package, since one macro is used either for VDD or VSS, the entire macro, which have features distributed from the solder regions to the metal bumps on the opposing side of the redistribution structure, are tied to VDD or VSS. The entire chip area occupied by the macros cannot be used for the routing of other features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8B through 8E illustrate the cross-sectional views of intermediate stages in the manufacturing of a package component including a PG redistribution network in accordance with some embodiments.

DETAILED DESCRIPTION

Figure 1A:
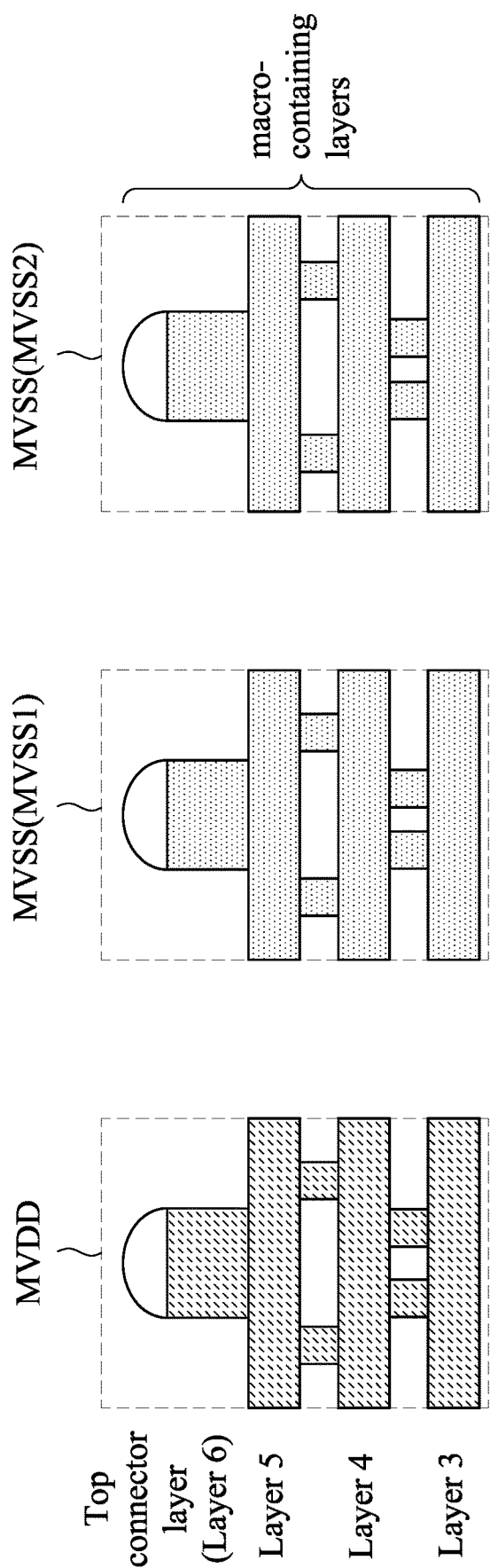
FIGS. 1A, 1B, 2A, 2B, 3A, 3B, 4A, 4B, 5A, and 5B illustrate cross-sectional views and top views of intermediate stages in the design of a Power-ground (PG) redistribution network in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of designing and laying out Power-ground (PG) networks for a redistribution structure and the resulting package components are provided. In accordance with some embodiments of the present disclosure, a redistribution structure includes PG networks and signal redistribution lines. The redistribution structure includes upper layers, and lower layers underlying the upper layers. A plurality of PG macros, which are pre-designed and saved in a cell library, are picked and placed into a layout of the redistribution structure. The PG macros are in the upper layers, and do not extend into the lower layers. The PG networks in the lower layers are designed, laid out, and connected to the macros to finish the layout of the power networks. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 9:
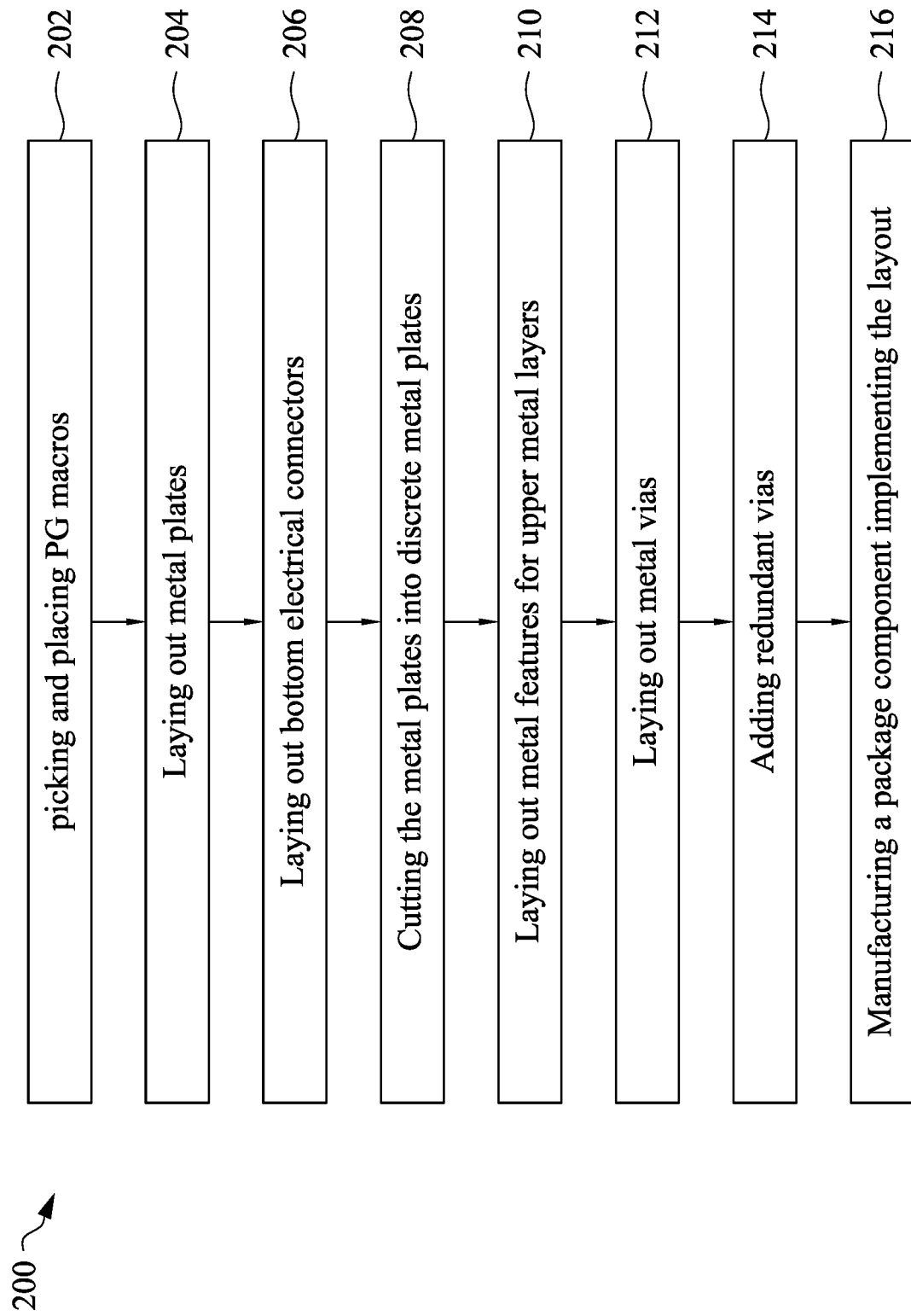
FIG. 9 illustrates a process flow for designing and manufacturing a package including a PG network in accordance with some embodiments.

FIGS. 1A, 1B, 2A, 2B, 3A, 3B, 4A, 4B, 5A, and 5B illustrate cross-sectional views and top views of intermediate stages in the design and layout of PG networks in accordance with some embodiments of the present disclosure. The corresponding processes are also reflected schematically in the process flow 200 as shown in FIG. 9.

Figure 4A:
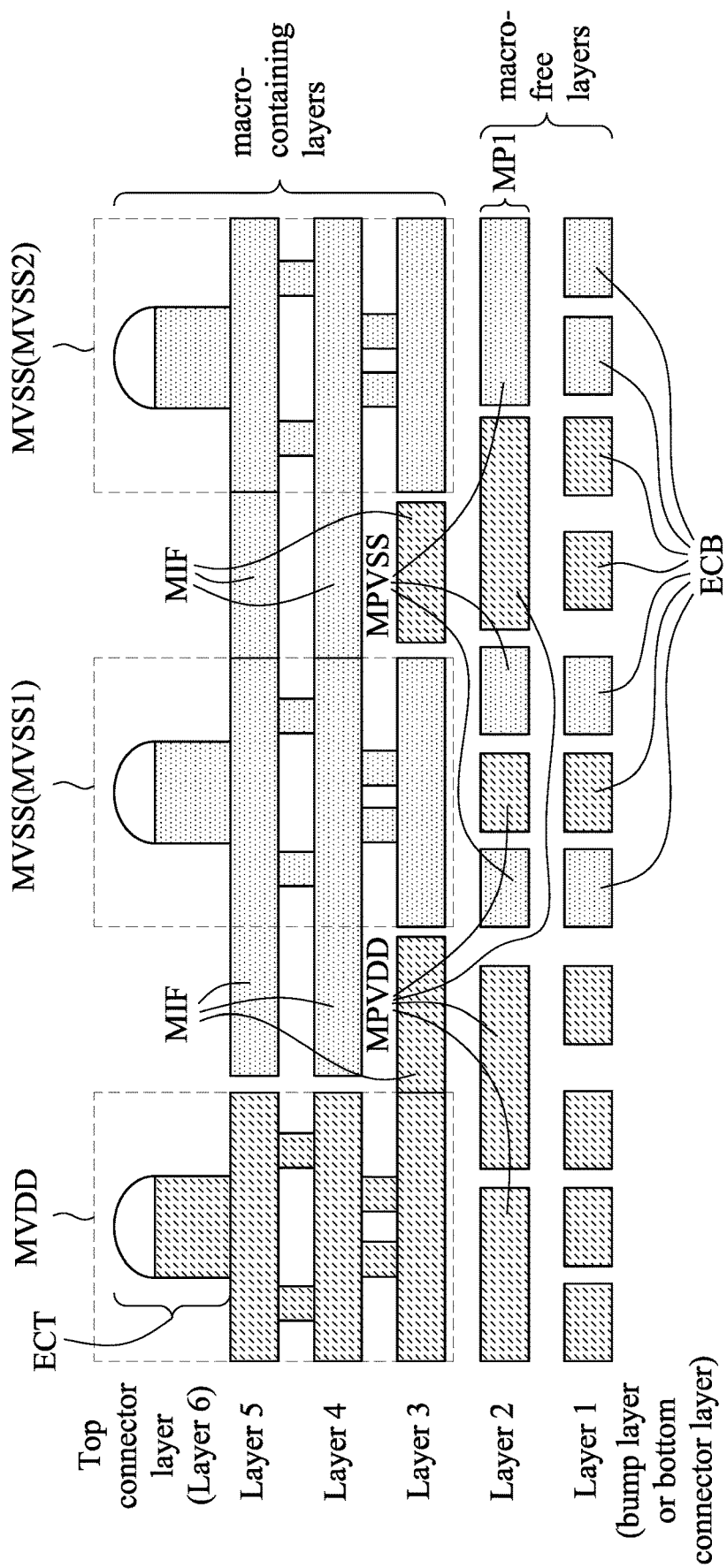
Figure 4B:
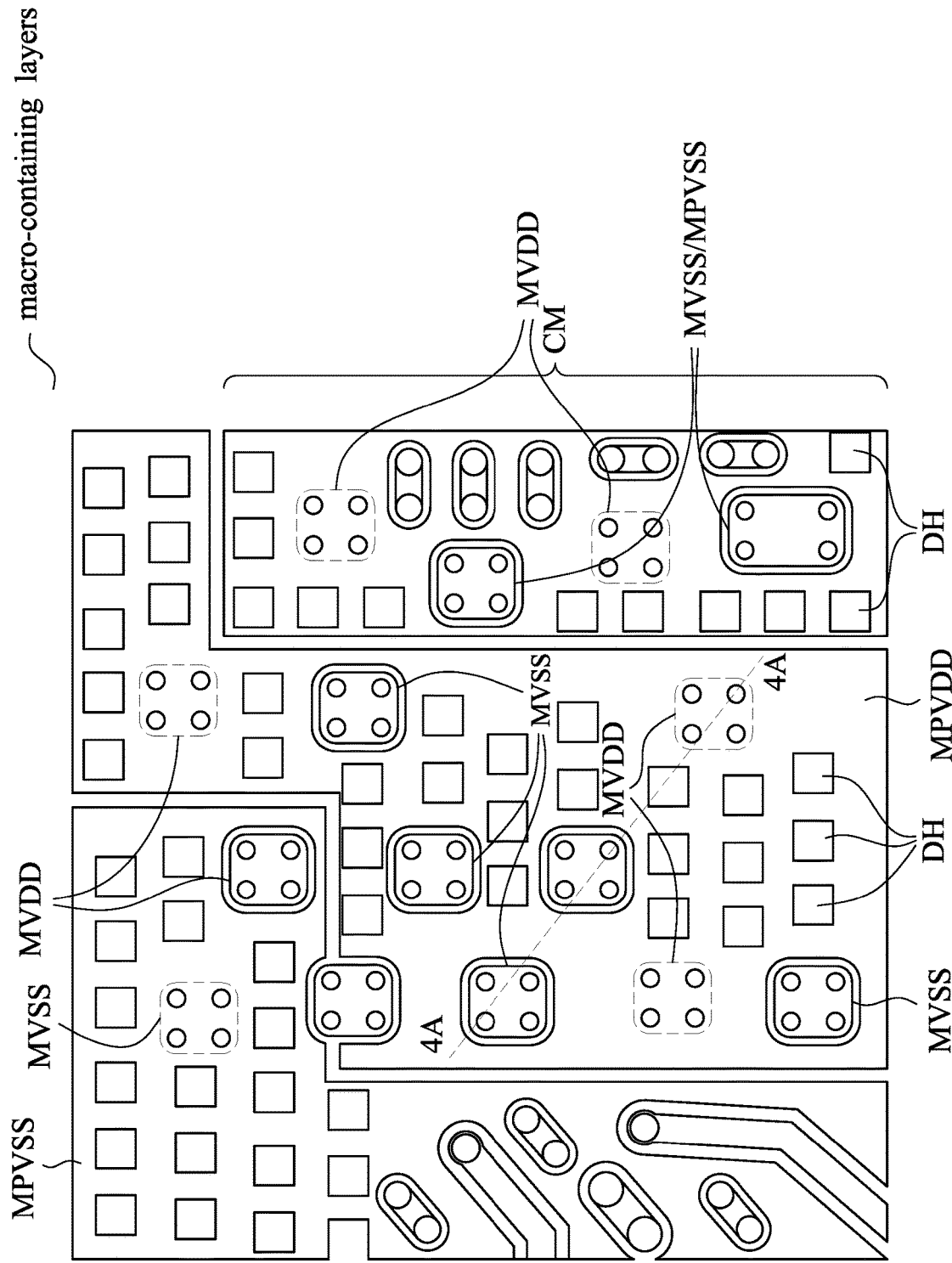
Figure 5A:
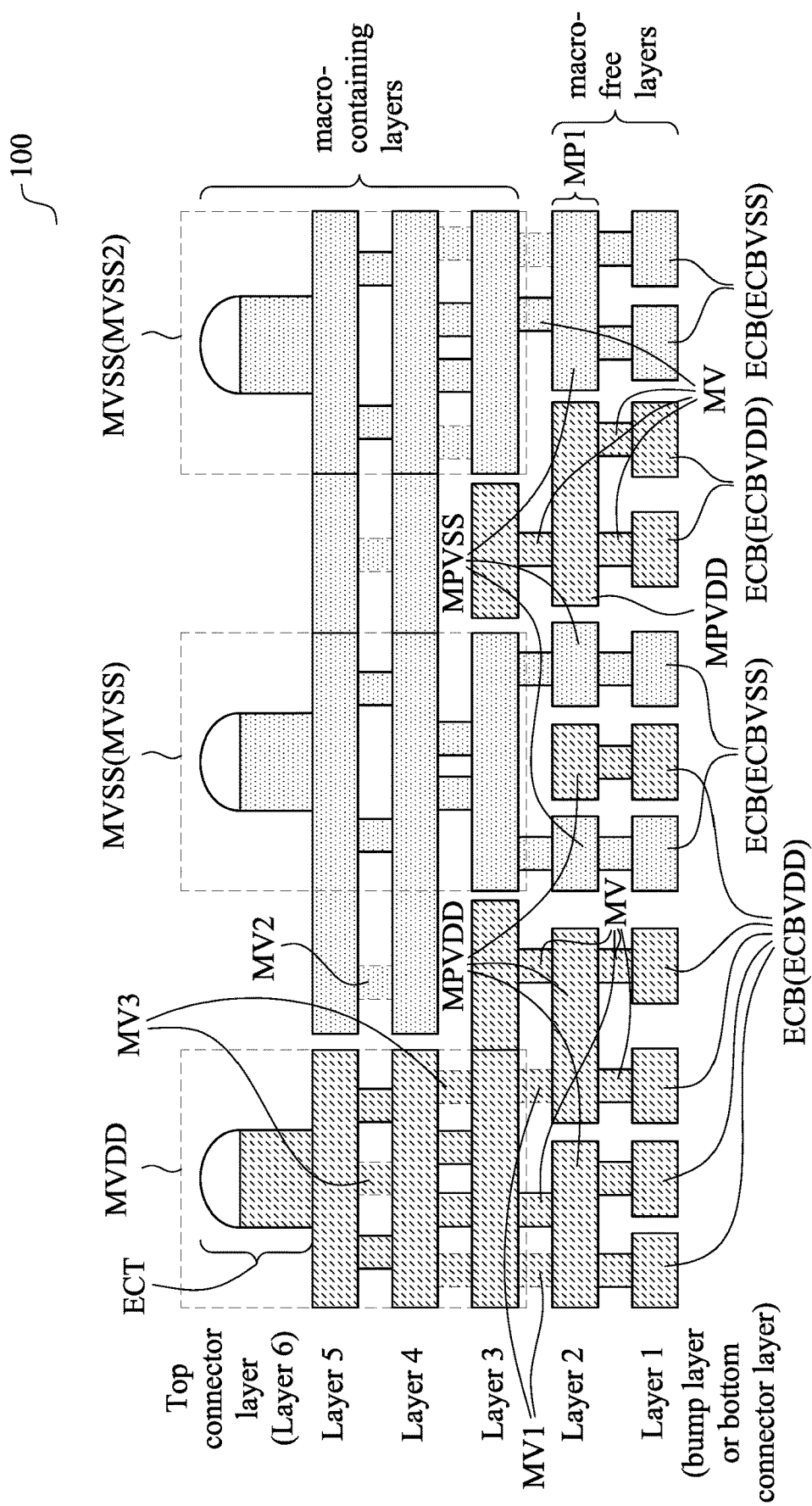

Referring to FIG. 5A, a cross-sectional view of a layout of a redistribution structure 100, which is to be designed by the design process of the present disclosure, is illustrated. It is appreciated that the design processes as shown in FIGS. 1A, 1B, 2A, 2B, 3A, 3B, 4A, 4B, 5A, and 5B are in the design stages, and are not performed on physical entities such as wafers, dielectric materials, metals, and the like. Accordingly, when the features as in these layers are referred to as (metal) lines/pads/plates, or the like, these features are actually the patterns of these features in the layout, and the corresponding features are manufactured as physical entities after the design and layout is finished.

In accordance with some embodiments of the present disclosure, the layout of the redistribution structure 100 may be in the form of Graphic Data System (GDS) format, or any other applicable formats. In the processes as shown in FIGS. 1A, 1B, 2A, 2B, 3A, 3B, 4A, 4B, 5A, and 5B, a computer may be used to design and layout the layouts of the redistribution structure 100. After the layout is finished, the layout of the redistribution structure 100 is saved, for example, to a storage such as a hard disk, and is then taped out and implemented as a physical package, as shown as an example in FIG. 8A.

As shown in FIG. 5A, the redistribution structure 100 includes a plurality of metal layers, with metal lines and metal plates (metal planes) being formed in the plurality of metal layers. The plurality of metal layers further include lower layers, and upper layer over the lower layers. In accordance with some embodiments of the present disclosure, the lower layers are referred to as PG macro-free layers since the PG macros don't extend into these layers. The upper layers are referred to as PG macro-containing layers since the PG macros extend into each of these layers. In accordance with some embodiments of the present disclosure, the lower layers include at least two layers, namely layer 1 and layer 2. Layer 1 is also referred to as a bottom (electrical) connector layer or a bump layer, which includes the metal bumps, metal pads, or the like, which are used to electrically connect to (and may be bonded to) other package components such as interposers, package substrates, printed circuit boards, or the like. Layer 2 is a metal layer, which includes (the patterns) of metal features such as metal lines, metal plates, metal pads, and the like. The lower layers include at least two layers, and may include more layers such as 3, 4, 5, or more metal layers. The power plates and power lines in the lower layers are laid out without using PG macros.

The macro-containing layers (upper layers) may include a plurality of metal layers such as two layers, three layers, four layers, or more. The upper layers may also include a top connector layer, which includes electrical connectors such as metal pillars, solder regions, metal pads, Under-bump Metallurgies, or the like. In the examples illustrated in FIGS. 1A, 1B, 2A, 2B, 3A, 3B, 4A, 4B, 5A, and 5B, two lower layers and four upper layers are used as an example, and different numbers of the lower layers and upper layers are also within the scope of the present disclosure. It is also appreciated that the figures of the present disclosure mainly present the power networks, while signal lines are also laid out in the same layers in which the PG networks are located. The layout of the signal lines, however, is not presented in detail.

Before the layout process, PG macros may be designed and saved in a library, and may be saved in a hard disk or other types of storage. There may be a plurality of macro designs to suit to different design requirements. For example, the sizes, the number of vias contained in the design macros, etc., in different PG macros may be different from each other. The design of some PG macros for VDD may be the same as, or different from, the design of some PG macros for VSS. There may also be a plurality of different designs of PG macros for VDD, and a plurality of different designs of PG macros for VSS. The PG macros VDD may also be referred to as power macros VDD, and PG macros VSS may also be referred to as ground macros VSS.

The processes for designing and laying out the layout of redistribution structure 100 (FIG. 5A) are illustrated in FIGS. 1A, 1B, 2A, 2B, 3A, 3B, 4A, 4B, 5A, and 5B. Referring to FIG. 1, in an initial stage of the layout process, a plurality of PG macros are picked from the library, and are placed into a layout, which may be a blank layout at this stage, or may include some layouts (such as signal lines) already. The respective process is illustrated as process 202 in the process flow 200 as shown in FIG. 9. The pre-designed PG macros include PG macros MVDD, which are the macros of VDD (positive power supply), and PG macros MVSS, which may be the macros of electrical ground. The PG macros may also be identified with a number "1", "2," or the like to distinguish individual PG macros. In the illustrated example, the PG macros MVDD and MVSS extend into layers 3-5 and a top connector layer. Alternatively stated, the design of the PG macros MVDD and MVSS include the design of the patterns of the metal features in layers 3-5 and the top connector layer (layer 6), and do not include the design of the metal features in the lower layers, namely layers 1 and 2 in the illustrated example. This also means that when PG macros MVDD and MVSS are placed into certain chip areas of the redistribution structure, the upper layers in the corresponding chip areas in the macro-containing layers are occupied by the already-designed features. The chip areas directly underlying the macro-containing layers, however, are still open for laying out other features.

As shown in FIG. 1A, some of the PG macros are identical to (or different from) each other. Also, some of the PG macros MVDD may be identical to (or different from) other PG macros MVDD, and may be identical to some PG macros MVSS. The identical structures can be used to identify the existence of the PG macros from the physical package components that have been manufactured by implementing the corresponding layout.

Figure 1B:
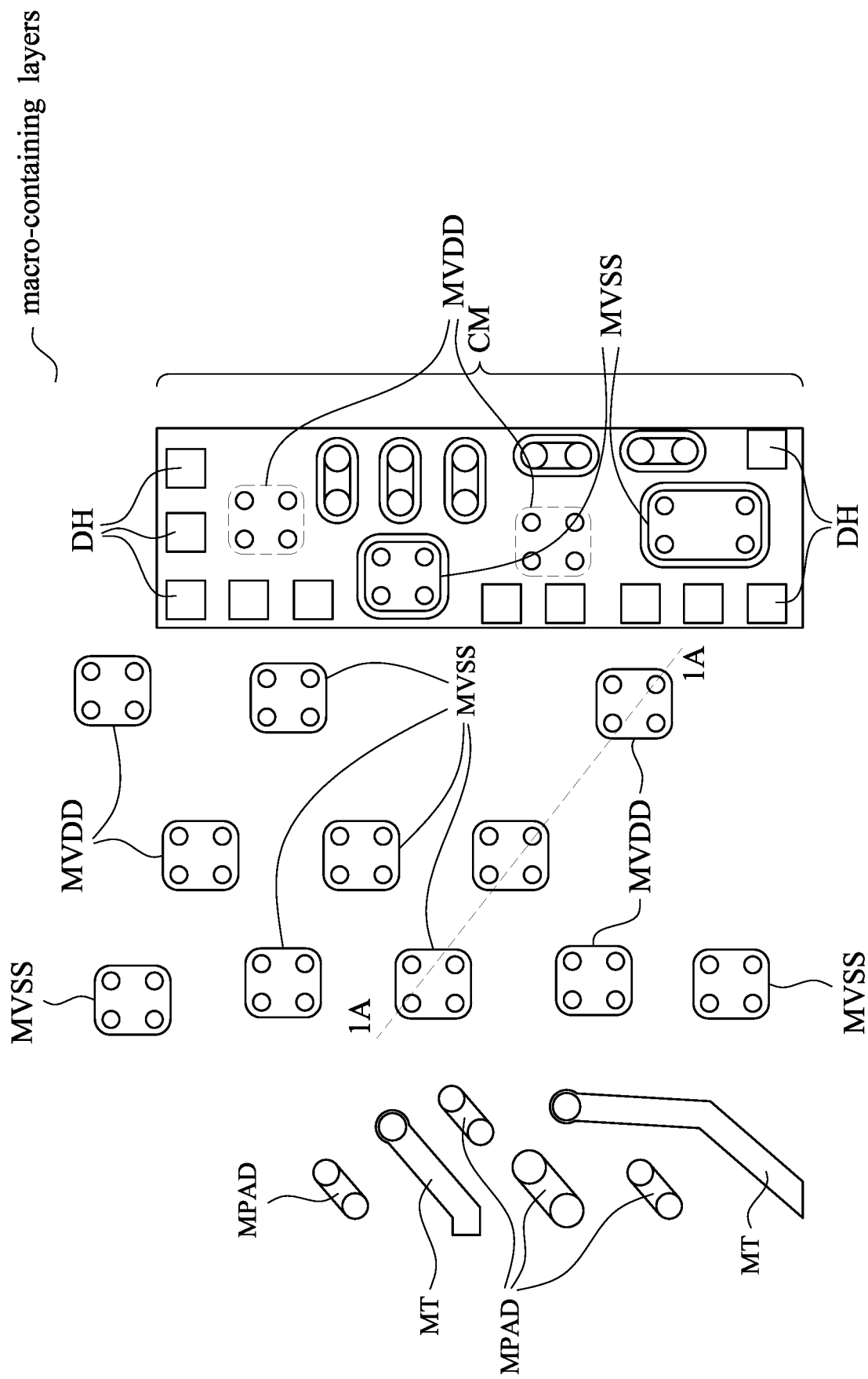

In accordance with some embodiments, a PG macro MVDD (and a MVSS) includes a plurality of metal plates, each in one of the upper layers. The top-views shapes and sizes of the metal plates of the same PG macro in different metal layers may be the same as each other (for example, all have the same square shape or rectangular shape as shown in FIG. 1B), or may be different from each other. Vias are formed to interconnect the metal plates in neighboring layers. It is appreciated that the vias in a via-layer are vertically offset from immediate overlying and underlying vias since design rules may require that the vias in two neighboring via-layers to have certain lateral spacing.

FIG. 1B illustrates a top view of a plurality of placed macros MVDD and MVSS in accordance with some embodiments. The cross-sectional view as shown in FIG. 1A illustrates the reference cross-section 1A-1A in FIG. 1B. The illustrated top view shows the part of the placed macros in one of the metal layers 3, 4, and/or 5. FIG. 1B illustrates a plurality of rectangular macros as an example, which are either PG macros MVDD or MVSS. In accordance with some embodiments of the present disclosure, the placed PG macros MVDD or MVSS are surrounded by large chip areas, and are spaced apart from each other. In accordance with some embodiments of the present disclosure, some of the PG macros MVDD or MVSS are parts of composite macros (for example, the composite macro CM as illustrated). Composite macro CM may include one or a plurality of PG macros MVDD or MVSS therein. Composite macro CM may also include some degassing holes DH, which are formed as holes in the respective metal plate to reduce the pattern loading effect, which occurs when the respective metal layer is formed in a plating process in the manufacturing stage.

In FIG. 1B, each of the PG macros MVDD or MVSS includes four vias, each being shown as a circular pattern at a corner of the respective PG macro. It is appreciated that the number of vias in each of the PG macros MVDD or MVSS may be different from what are illustrated. For example, each of PG macros MVDD or MVSS may include two to tens of rows and two to tens of columns of vias. The vias may also be arranged as an array, or may be arranged as having a beehive (hexagonal) pattern.

In addition, in the illustrated chip area, there may be some metal traces MT, which may be laid out before or after the placement of PG macros MVDD or MVSS. The pattern of the metal traces MT in different metal layers may be different from the pattern of the metal traces MT in other metal layers, although they may also be the same in a certain chip area.

As shown in FIG. 1B, there are also some metal pads MPAD, which are elongated with the circular patterns on opposing ends, with the circular patterns representing metal vias. Each of the metal pads is used for connecting two vias, with one via at one end and is used to connect to an overlying metal feature, and the other via is at the other end and is used to connect to an underlying metal feature.

Figure 2A:
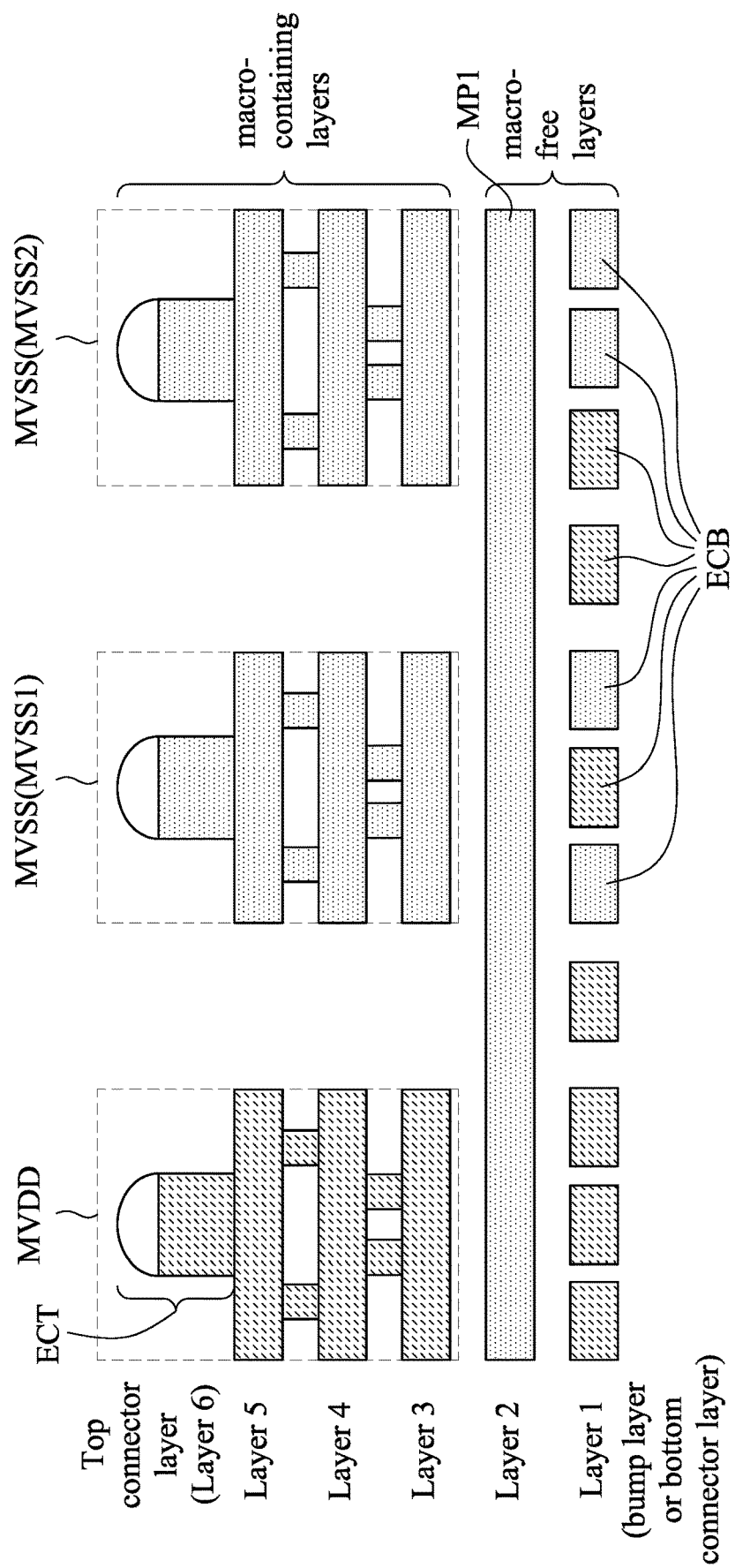
Figure 2B:
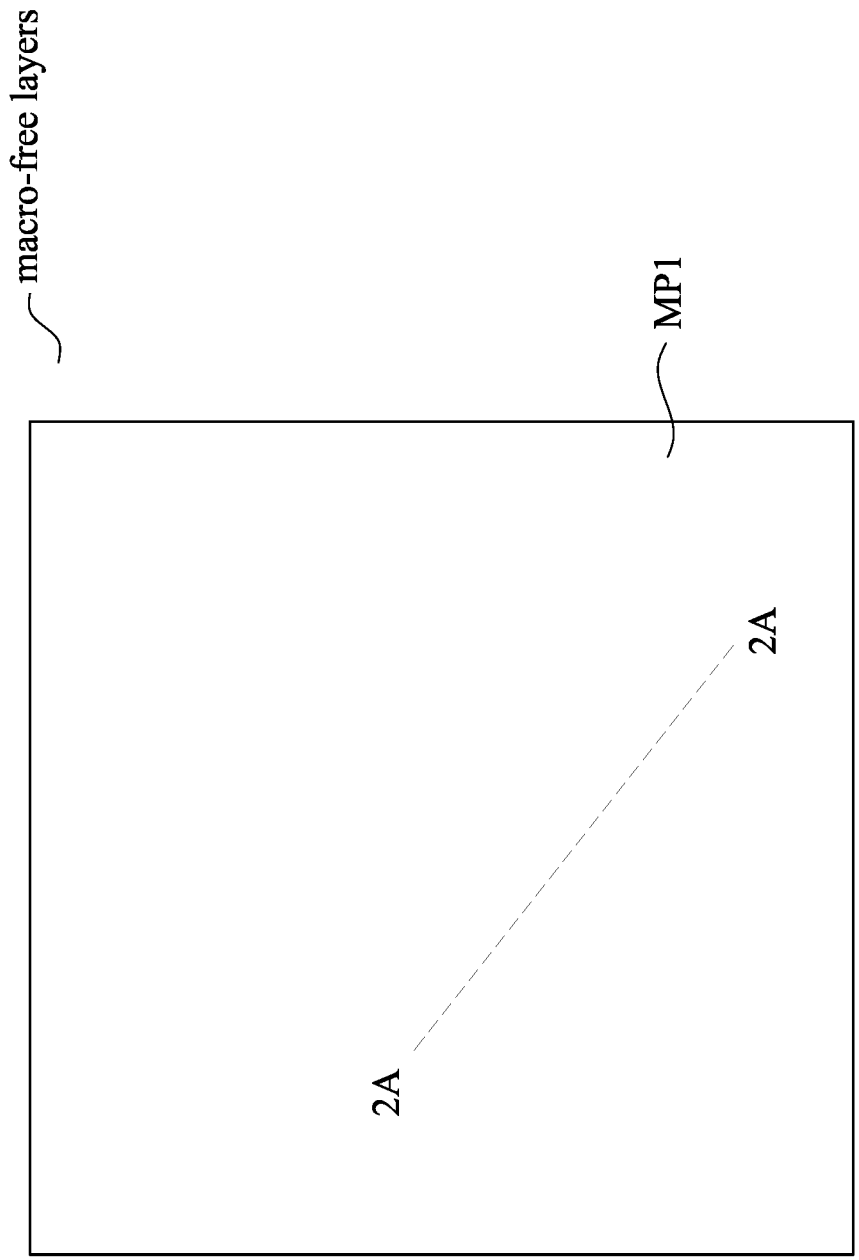

FIG. 2A illustrates the layout process for laying out metal plate MP1 into metal layer 2, and the layout of electrical connectors ECB into metal layer 1. The respective processes are illustrated as process 204 and 206 in the process flow 200 as shown in FIG. 9. In accordance with some embodiments of the present disclosure, metal plate MP1 is a metal plate that extends to a chip area overlapped by a plurality of PG macros MVDD and MVSS. For example, in FIG. 2A, metal plate MP1 extends continuously to (and may extend beyond) the left edge of the leftmost PG macro MVDD, and extends to (and may extend beyond) the right edge of the rightmost PG macro MVSS. FIG. 2B illustrates a top view of metal plate MP1, which is a blank plate having no holes therein. In accordance with some embodiments of the present disclosure, the entire region as illustrated in FIG. 1B is over the continuous metal plate MP1 as shown in FIG. 2B. Metal plate MP1 may also be larger than the illustrated region in FIG. 1B, and may extend beyond the boundaries of the illustrated region in one or all lateral directions.

Referring back to FIG. 2A, a plurality of electrical connectors ECB, which may be metal pads, metal pillars, or the like, are added into layer 1. The plurality of electrical connectors ECB include some electrical connectors overlapped by the PG macros MVDD and MVSS, and some other electrical connectors vertically misaligned from the PG macros MVDD and MVSS. It is appreciated that although some of PG macros MVDD and MVSS are identical to each other, the patterns, locations, sizes of the electrical connectors ECB directly underlying these PG macros have the freedom of design, and may be the same or different from each other. Accordingly, the patterns, locations, the total number, the connections, and the sizes of the electrical connectors ECB overlapped by one PG macro may be different from (or the same as if desirable) the corresponding patterns, locations, total number, connections, and sizes of the electrical connectors ECB under another identical PG macro. In accordance with some embodiments, all of the electrical connectors ECB overlapped by a PG macro may be electrically disconnected from the PG macro.

It is appreciated that in the embodiments in which the macro-free layers include more metal layer(s) over layer 2, for each of the metal layers in the macro-free layers, there may be a metal plate added. The metal plates in different macro-free layers (lower layers) may or may not have the same top-view shape, and may or may not have the same top-view size.

Figure 3A:
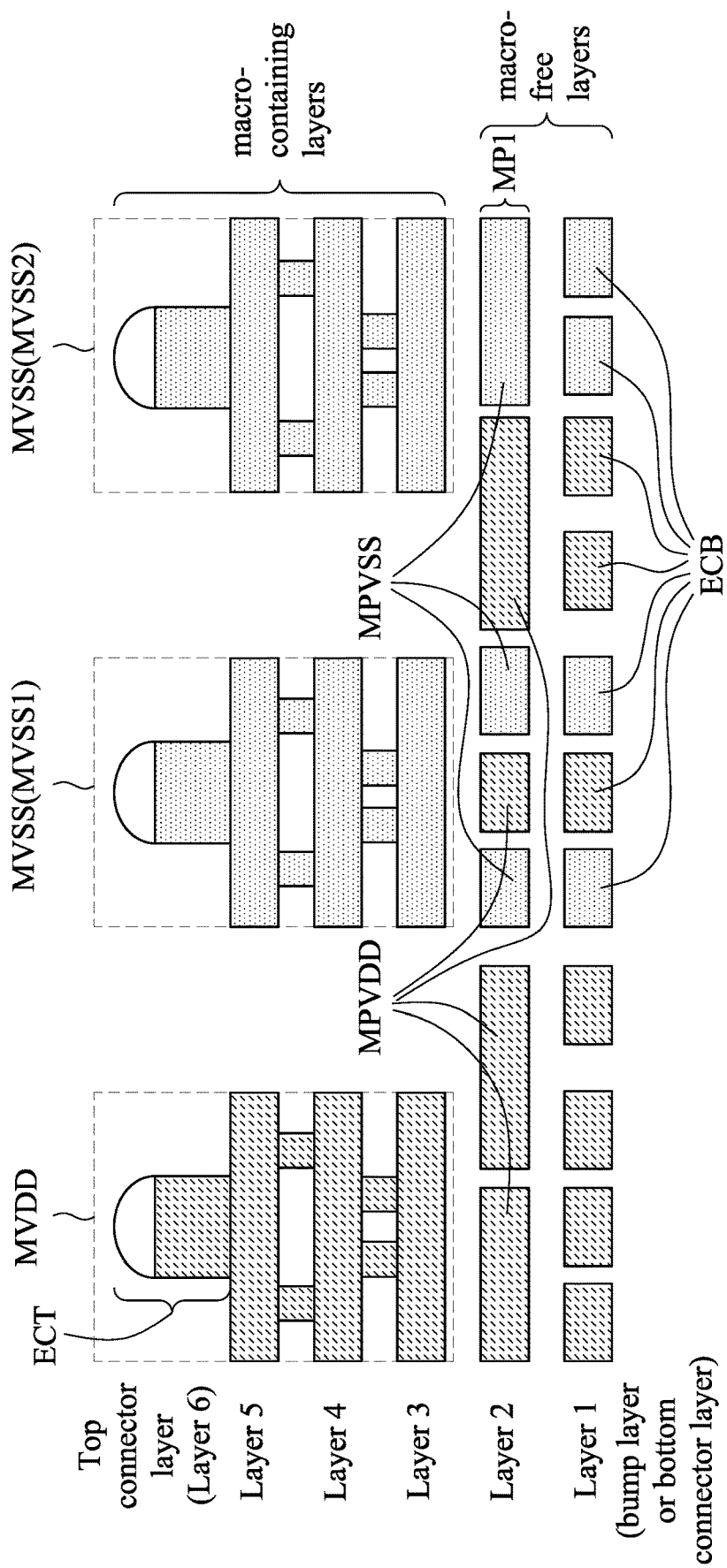

FIG. 3A illustrates the cross-sectional view of the redistribution structure after the metal plate MP1 is patterned (cut) to form different patterns, wherein some of the patterns are to be connected to PG macros MVDD, and some other patterns are to be connected to PG macros MVSS. There may also be some patterns used for signal routing. The respective process is illustrated as process 208 in the process flow 200 as shown in FIG. 9.

Figure 3B:
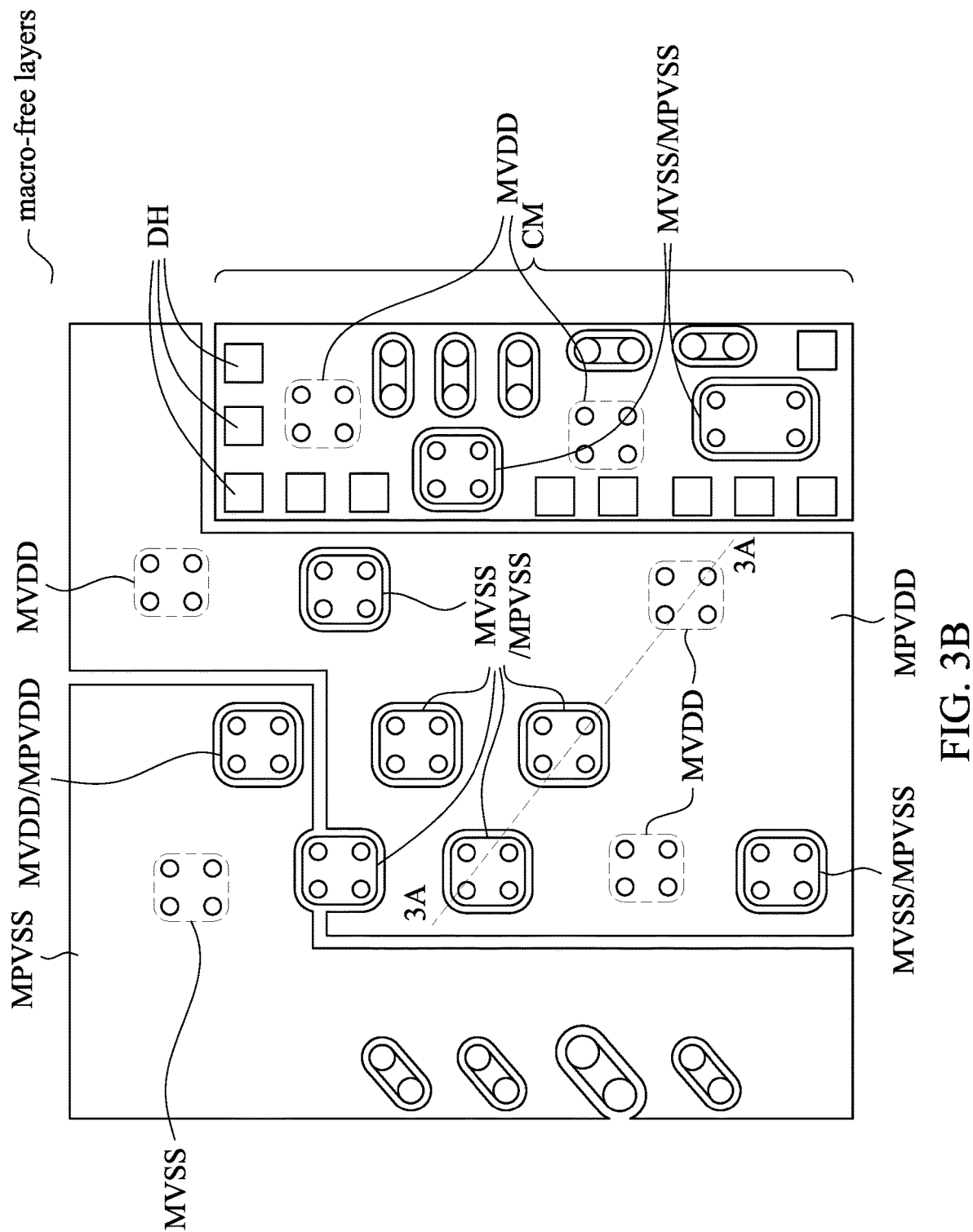

FIG. 3B illustrates a top view of the cut metal plate MP1. It is appreciated that although PG macros MVDD and MVSS are illustrated in FIG. 3B, the illustrated PG macros MVDD and MVSS are actually overlying, and not in, the illustrated layer (such as layer 2) in FIG. 3B. Accordingly, the locations having the illustrated PG macros MVDD and MVSS are actually metal plates. Furthermore, the metal plates in layer 2 may have the same pattern as, or a different pattern from, the metal plates in the respective overlying PG macros.

As shown in FIG. 3B, the large metal plate MP1 as shown in FIG. 2B are patterned into a plurality of smaller metal plates MPVDD and MPVSS. The metal plates MPVDD are used for carrying power supply voltage VDD, and metal plates MPVSS are used for carrying the potential of electrical ground. In a large metal plate MPVDD, there may be one or a plurality of smaller metal plates MPVSS, and in a large metal plate MPVSS, there may be one or a plurality of smaller metal plates MPVDD. Accordingly, metal plate MP1 as shown in FIG. 2B are separated into a plurality of larger and smaller metal plates. Some of features are marked as MVSS/MPVSS, which indicates that these parts of the metal plate in metal layer 2 are MPVSS, which are underlying (and will be connected to) the overlying PG macros MVSS. Also, although the pattern of the metal plates MPVSS (marked using dashed squares) and their overlying PG macro MVSS are shown as the same, they may also be different from each other. Similarly, some of features are marked as MVDD/MPVDD, which indicates that this part of the metal plate in metal layer 2 are MPVDD, which are underlying (and will be connected to) the overlying PG macros MVDD. Also, although the pattern of the metal plates MPVDD (marked using dashed squares) and their overlying PG macros MVDD are shown as the same, they are also be different from each other.

Metal plates MPVDD are physically separated from neighboring metal plates MPVSS. Neighboring metal plates MPVDD, when there is no metal plate MPVSS separating them from each other, are merged to form a larger metal plate. For example, in the middle of FIG. 3B, there is a large metal plate MPVDD. In an example embodiment, the large metal plate carries electrical supply voltage VDD. Inside the metal plates MPVDD, there may be some dashed features marked as MVDD. These are the patterns of the overlying PG macro MVDD, which are in upper metal layers, and are electrically connected to metal plate MPVDD through vias. The metal plate MPVSS inside the larger metal plate MPVDD are electrically connected to the overlying PG macro MVSS. The smaller metal plates MPVSS are spaced apart and electrically isolated from its encircling large metal plate MPVDD. The patterns, the locations, and the size of metal plates MPVSS may be different from the overlying PG macro MVSS (FIG. 1B).

Similarly, there are some larger metal plates MPVSS (such as the metal plate MPVSS on the left side of FIG. 3B), and there are smaller metal plates MPVDD inside the larger metal plates MPVSS. The smaller metal plates MPVDD are spaced apart and electrically isolated from its encircling large metal plate MPVSS. Inside the metal plates MPVSS, there may be some dashed features marked as MVSS. These are the patterns of PG macro MVSS, which are in upper metal layers, and are electrically connected to metal plate MPVSS through vias. The small metal plate MPVSS inside the larger metal plate MPVDD are electrically connected to the overlying PG macro MVSS. The patterns, the locations, and the size of the small metal plates MPVDD may be different from the overlying PG macro MVDD (FIG. 1B).

Through the formation scheme as shown in FIGS. 2A, 2B, 3A, and 3B, large metal plates MPVDD and MPVSS (rather than thin metal lines) are formed for VDD and VSS power supply. The power impedance is thus reduced than in the power schemes in which relatively thin metal traces are used to supply power.

FIG. 4A illustrates the layout (adding) of metal features MIF into the macro-containing layers (such as layers 3-5) as shown in FIG. 3A, which metal features MIF interconnect neighboring PG macros MVDD together, and interconnect neighboring PG macros MVSS together. The respective process is illustrated as process 210 in the process flow 200 as shown in FIG. 9. It is appreciated that in FIG. 4A, the added metal features MIF are shown as forming interfaces with the original PG macros MVDD and MVSS. These interfaces, however, are for showing where the boundaries of PG macros MVDD and MVSS are, while these interfaces actually do not present in the layout, and do not present in the final physical packages that are manufactured.

FIG. 4B illustrates a top view of FIG. 4A. The top view represents one of the macro-containing layers (for example, layers 3, 4, and/or 5). After the metal interconnect features MIF are added, the isolated PG macros MVDD and MVSS as shown in FIG. 1B become parts of power planes with large metal plates MPVDD and MPVSS for carrying power supply and electrical ground, as compared to power mesh.

Referring to FIG. 5A, metal vias MV are laid out to connect the electrical connectors ECB to the overlying metal plates MPVDD and MPVSS. The respective process is illustrated as process 212 in the process flow 200 as shown in FIG. 9. Some of the electrical connectors ECB are connected to metal plates MPVDD, and are denoted as electrical connectors ECBVDD. Some other electrical connectors ECB are connected to metal plates MPVSS, and are denoted as electrical connectors ECBVSS.

Figure 5B:
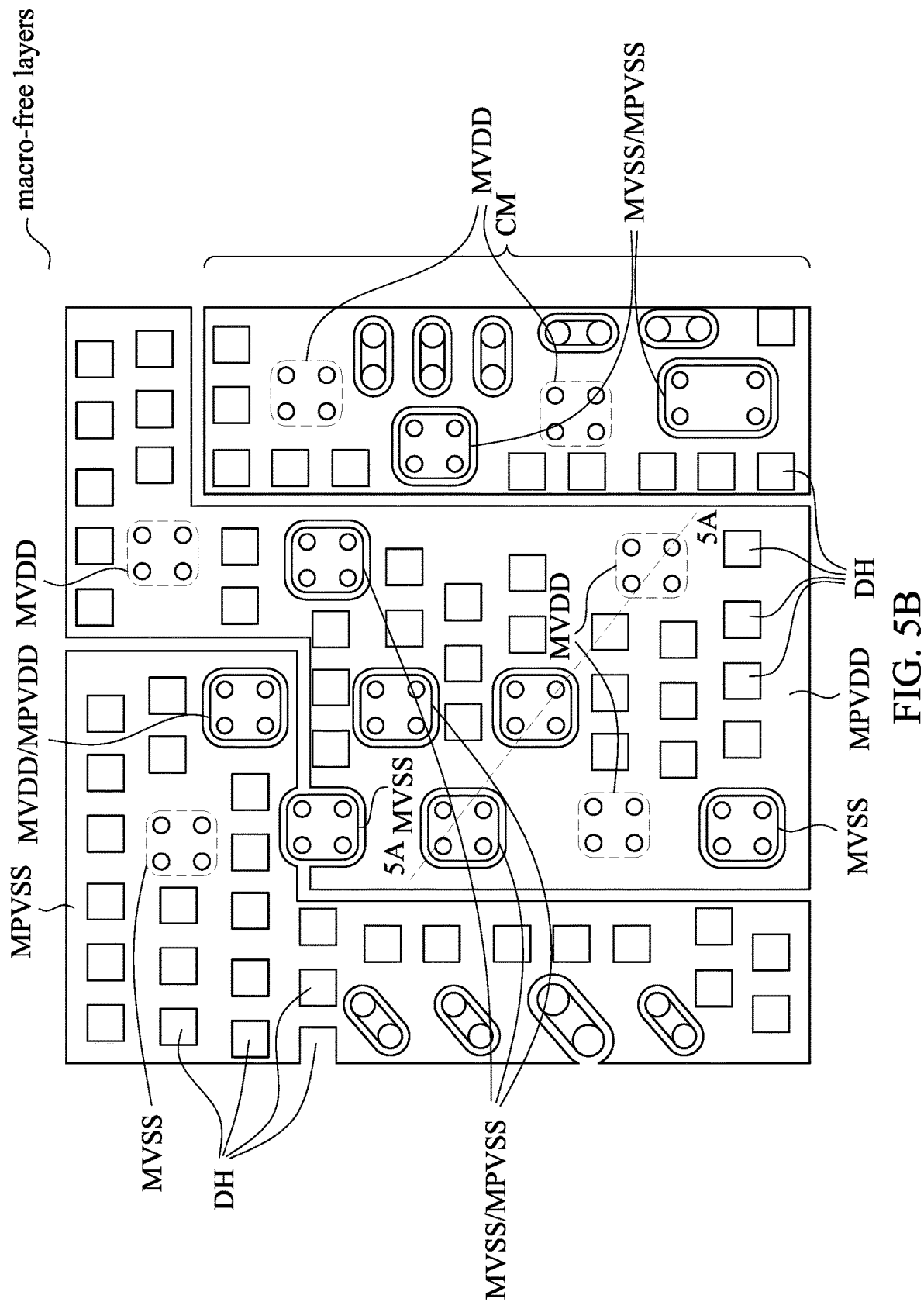

FIG. 5B illustrates a top view of the structure shown in FIG. 5A. The top view represents one of the macro-free layers (for example, layer 2). As compared to the top view as shown in FIG. 3B, a plurality of degassing holes DH are formed to reduce the density of metal pads MPVDD and MPVSS. With the high density of the power network area (as compared to the chip area mainly used for signal routing), pattern loading effect is more likely to occur, and the features in the chip areas with the higher metal density may be thinner than the features in the chip areas with the lower metal density. By forming the degassing holes, the pattern loading effect is reduced.

In accordance with alternative embodiments, degassing holes DH, instead of being formed in a step after the formation of metal plates MPVDD and MPVSS, may be formed in the same process shown in FIGS. 3A and 3B. Alternatively stated, in the same step for patterning metal plate MP1 to form metal plates MPVDD and MPVSS, degassing holes DH are also formed in metal plates MPVDD and MPVSS.

Referring back to FIG. 4B, degassing holes DH are also formed in macro-containing layers, so that the corresponding metal features in macro-containing layers (such as layers 3-5) may also have reduced pattern loading effect. The degassing holes DH in metal interconnect features MIF (FIG. 4B) and the degassing holes in metal plates MPVDD and MPVSS may be formed in the same layout modification step, or in separate layout modification steps.

Referring back to FIG. 5A, in accordance with some embodiments of the present disclosure, redundant vias MV1, MV2, MV3, etc., are laid out. The respective process is illustrated as process 214 in the process flow 200 as shown in FIG. 9. Some of the redundant vias (such as MV1) are used to connect metal features MPVDD and MPVSS to the overlying MP macros MVSS and MVDD. Some other redundant vias (such as MV2) are added in the upper layers and outside of PG macros MVDD and MVSS, and are used to electrically interconnect the PG macros MVDD, and to interconnect PG macros MVSS. Redundant vias may or may not be added inside PG macros MVDD and MVSS. FIG. 5A illustrates some example redundant vias MV3, which are added inside PG macros MVDD and MVSS providing it does not violate design rules.

The redundant vias may be added in the same layout step in which other vias are added to interconnect the metal features in different layers. Redundant vias may also be added in a layout step after the vias are added. In this embodiment, the layout software checks the locations in which redundant vias can be added without violating design rules, and adds the redundant vias. The redundant vias have the function of reducing the resistance in the power distribution network.

It is appreciated that the preceding processes include a plurality of processes including, for example, the adding of the metal features in macro-containing layers 3, 4, and 5, the layout of electrical connectors ECB, the layout of vias MV, the adding of redundant vias, etc. These processes may be performed in any order, and some of these process steps may also be performed at the same time.

Figure 6:
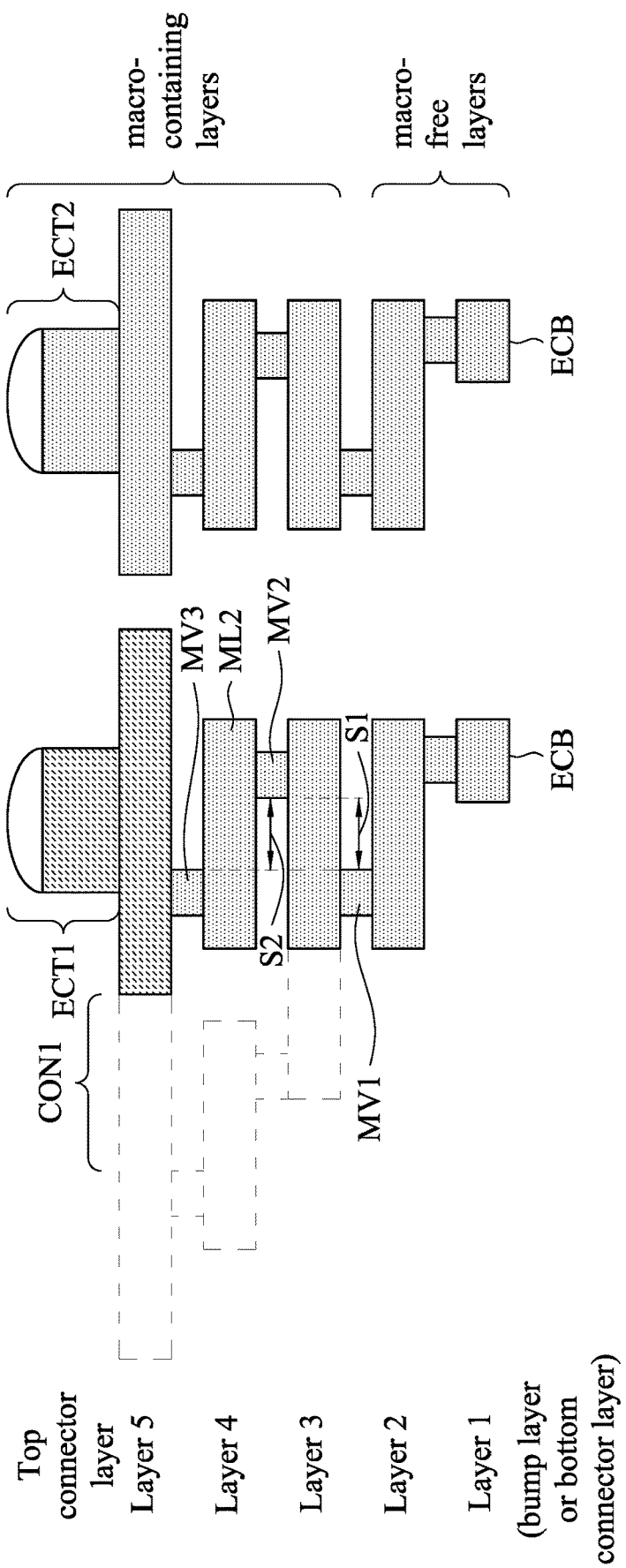
FIGS. 6 and 7 illustrate cross-sectional views of PG redistribution networks designed using shortest-path scheme in accordance with some embodiments.

FIG. 6 illustrates the layout of electrical connectors ECT1 and ECT2 at the top connector layer in accordance with some embodiments of the present disclosure. ECT1 may be a VDD connector or a signal connector for carrying electrical signal. ECT2 may be a VSS connector or a signal connector for carrying signal. Electrical connectors ECT1 and ECT2 are not parts of PG macros. Accordingly, the metal lines in layers 1 through 5 and electrical connectors ECT1 and ECT2 and the corresponding vias are laid out individually, without picking from library and placing. When individual metal features are laid out, a shortest-path scheme is used. For example, FIG. 6 illustrates some features drawn with dashed boxes, which represent the metal features laid out using conventional layout scheme. It shows that the dashed metal features, from bottom layer to the top layer, extend to a same direction (such as toward left). This causes that at metal layer 5, the electrical paths is far away from electrical connector ECT1, and a long connection line CON1 has to be used to connect to the top electrical connector ECT1. The reason that the overlying vias are not laid out to be overlapping the lower vias is that the design rule may require the vias overlying a metal feature and the vias underlying the same metal feature to have a minimum lateral spacing.

In accordance with some embodiments of the present disclosure, the layout of metal lines/plates and vias may be performed using a shortest-path scheme. For example, in FIG. 6, metal line/pad ML1 has a left end and a right end. Its underlying via MV1 is connected to the left end of metal line/pad ML1, and the overlying via MV2 is connected to the right end of metal line/pad ML1. The lateral spacing S1 between vias MV1 and MV2 may be equal to or greater than the minimum spacing allowed by the design rules. Metal line/pad ML2 also has a left end and a right end. Its underlying via MV2 is connected to the right end of metal line/pad ML2, and the overlying via MV3 is connected to the left end of metal line/pad ML2. The lateral spacing S2 between vias MV2 and MV3 may be equal to or slightly greater than the minimum spacing allowed by the design rules. Through this staggered layout, the bottom electrical connector ECB may be connected to the overlying top electrical connector ECT1 without the need to have a lateral long metal line/pad, and the overall resistance between bottom electrical connector ECB and top electrical connector ECT1 is reduced. Electrical connector ECT2 may also be connected to bottom connector ECB using shortest-path scheme.

Figure 7:
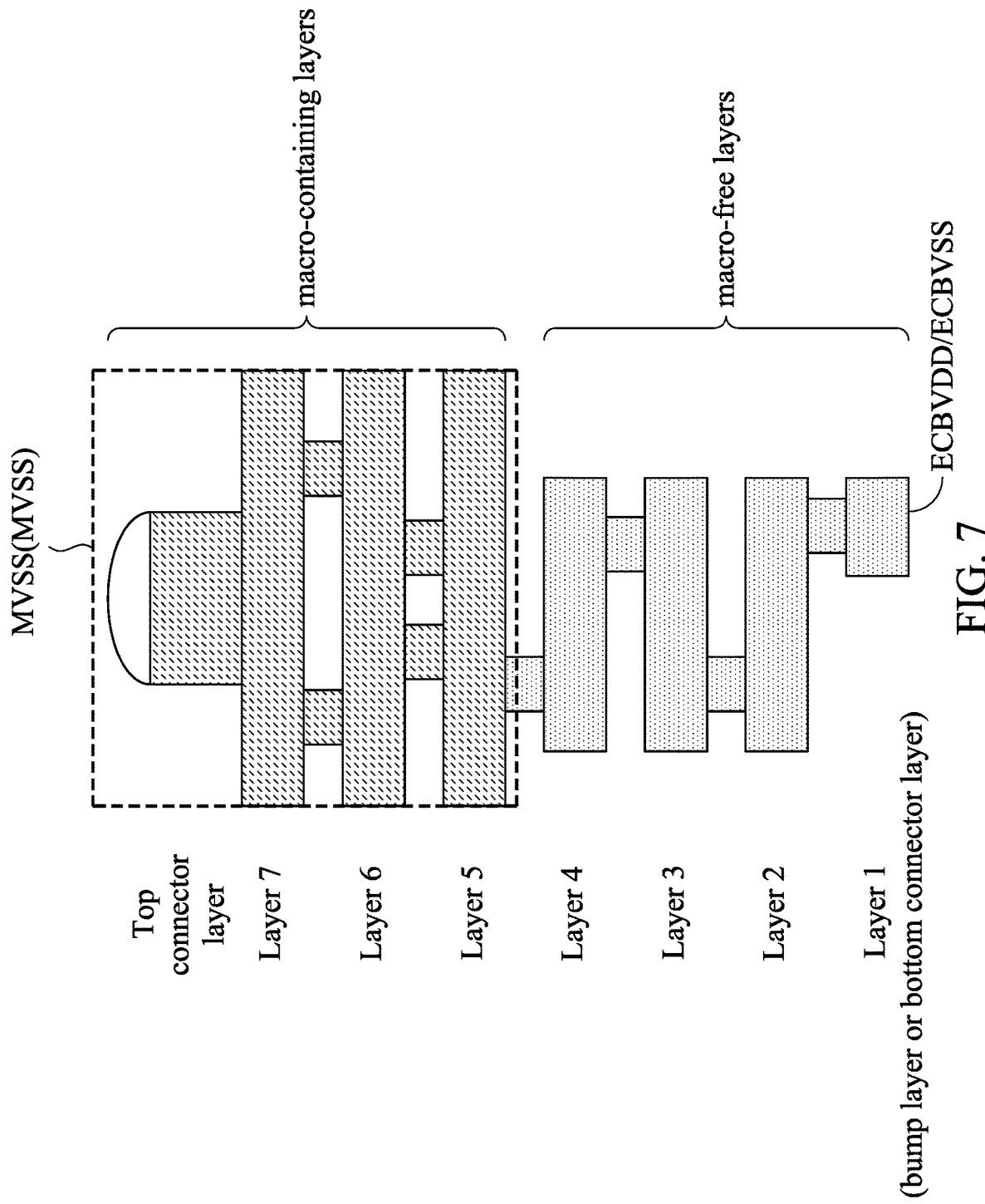

FIG. 7 illustrates the shortest-path scheme in accordance with some embodiments, in which the total number of macro-free layers is greater than two, for example, with the macro-free layers including metal layers 1, 2, 3, and 4, the shortest-path scheme may also be used to connect the bottom electrical connector ECB to the overlaying PG macro, which may be either PG macro MVDD or MVSS.

Figure 8A:
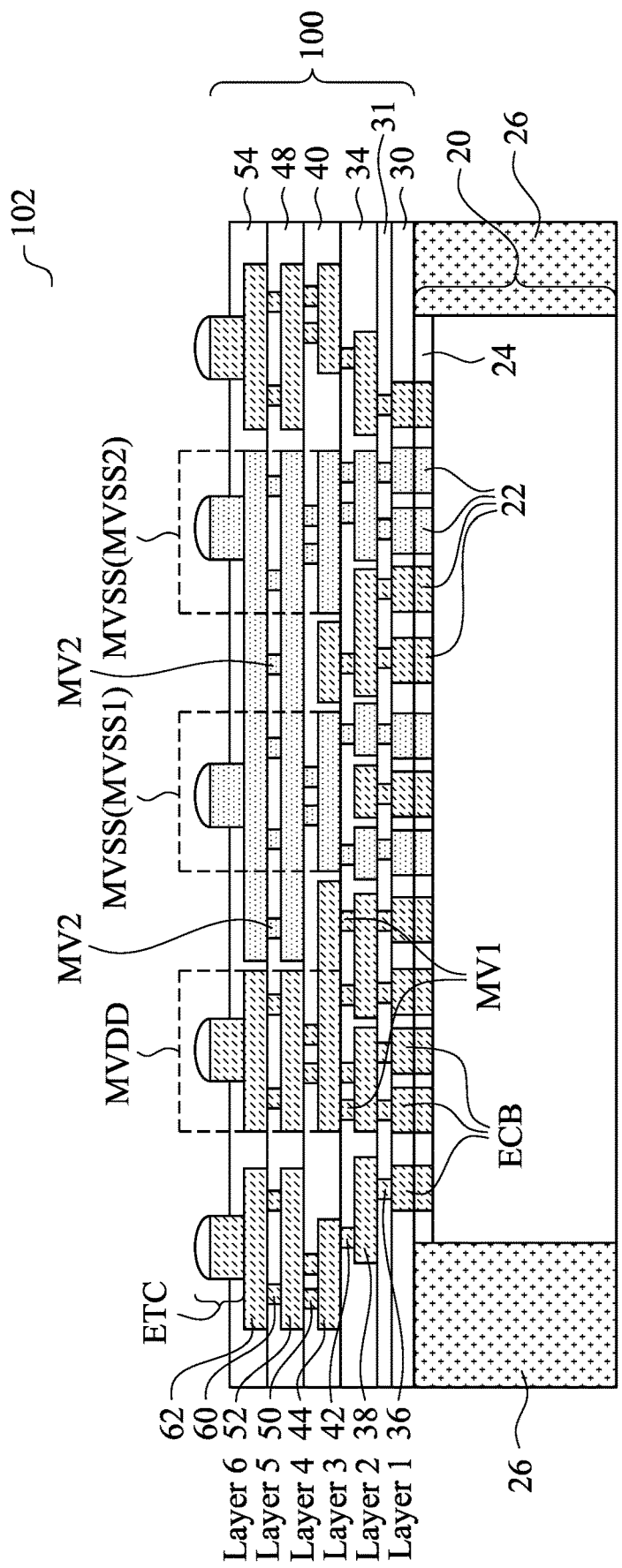
FIG. 8A illustrates a cross-sectional view of a package including a PG redistribution network in accordance with some embodiments.

After the layout is finished, the layout of the redistribution structure is tapped out, and a manufacturing process is performed to form a physical package component. The respective process is illustrated as process 216 in the process flow 200 as shown in FIG. 9. FIG. 8A illustrates a redistribution structure implementing the layout in accordance with some embodiments. It is appreciated that the illustrated structure includes an integrated fan-out package 102, in which the redistribution structure 100 extends laterally beyond the opposing edges of the underlying device die 20, so that top electrical connectors ETC with larger pitches may be formed to electrically connect to the electrical connectors in the device die 20. It is appreciated that the PG network and the corresponding redistribution structure 100 may be used in other package components including and not limited to, package substrates, interposers, or the like.

As shown in FIG. 8A, device die 20 includes a plurality of electrical connectors 22 at the top surface of device die 20. Electrical connectors 22 may include metal pillars, metal pads, or the like. Electrical connectors 22 may be located in dielectric layer 24, which may be formed of or comprise polybenzoxazole (PBO), polyimide, benzocyclobutene (BCB), or the like. Device die 20 may be encapsulated in encapsulant 26, which may be a molding compound, an epoxy, a resin, and/or the like. The top surface of device die 20 and encapsulant 26 may be coplanar with each other.

FIGS. 8B through 8E illustrate the intermediate stages in the manufacturing the integrated fan-out package 102 (which is a physical and tangible entity) as shown in FIG. 8A. A brief process is discussed herein. It is appreciated that since the PG redistribution network may be used on package components other than fan-out packages, other processes may be adopted.

Figure 8B:
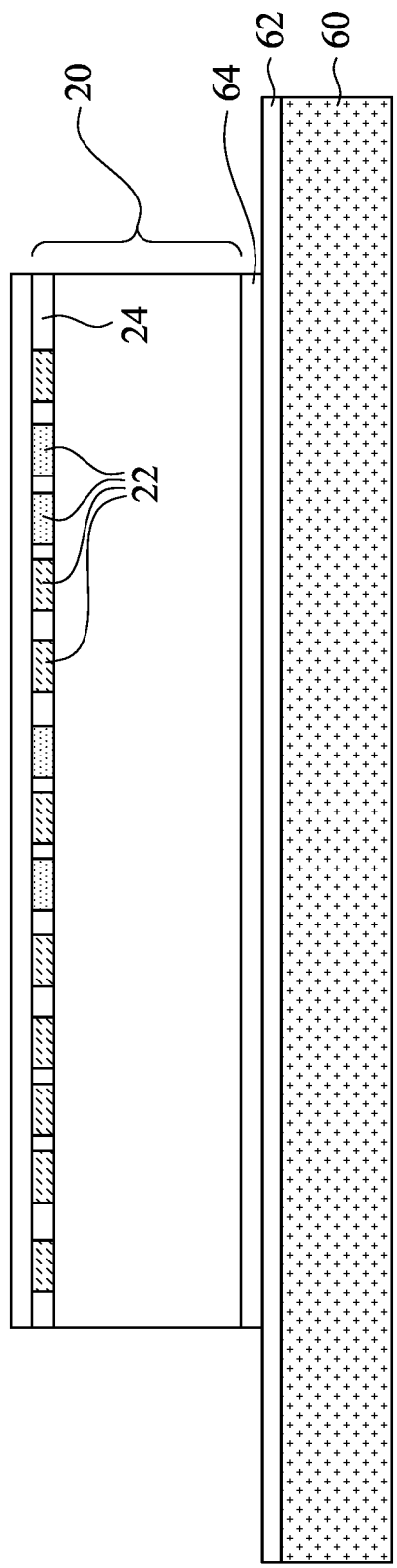
Figure 10:
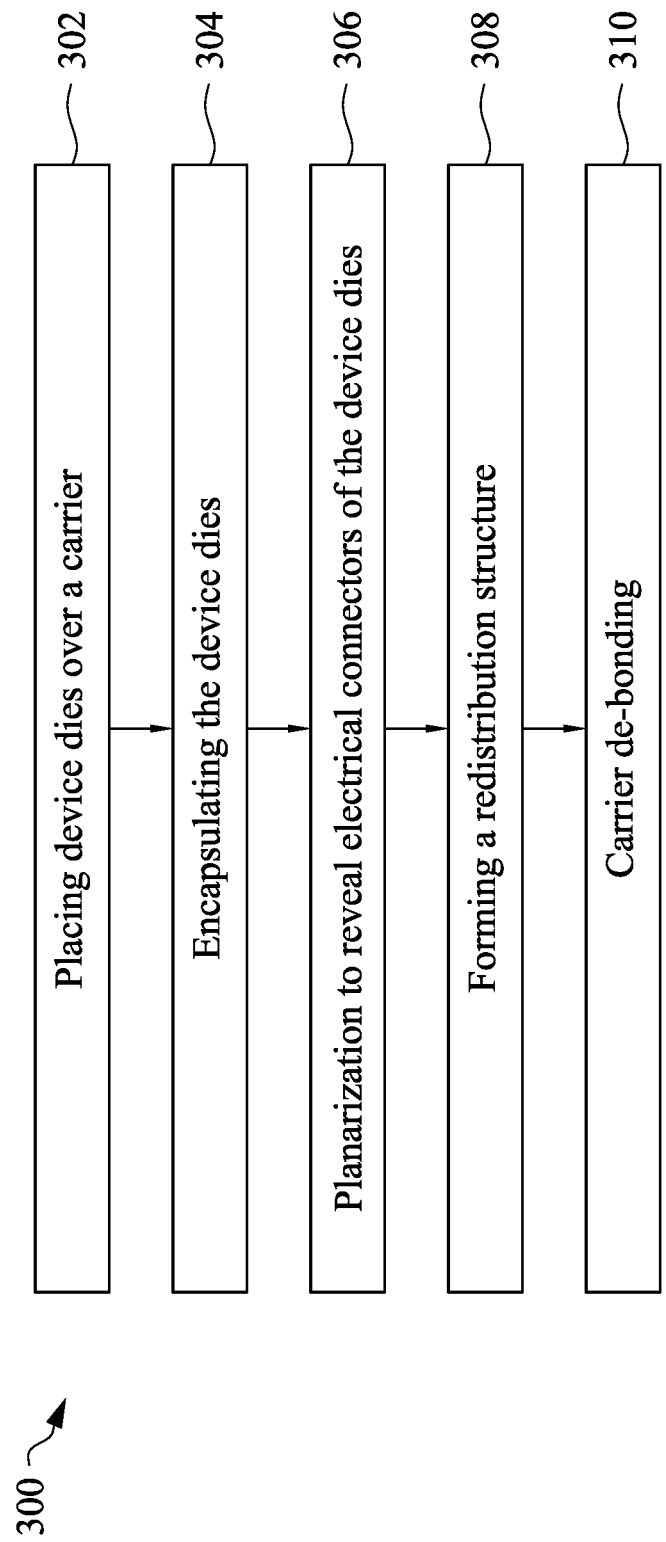
FIG. 10 illustrates a process flow for manufacturing a package including a PG network in accordance with some embodiments.

Referring to FIG. 8B, device die 20 is placed over carrier 60, which may be a glass carrier. The respective process is illustrated as process 302 in the process flow 300 as shown in FIG. 10. Release film 62, which may be a Light-To-Heat-Conversion (LTHC) film, is coated over carrier 60. Device die 20 may be adhered to release film 62 through die-attach film 64, which may be an adhesive layer. Although one device die 20 is illustrated, there may be a plurality of identical device dies identical to the device die 20 placed over carrier 60.

Referring to FIG. 8C, encapsulant 26 is dispensed and cured to encapsulate device die 20. The respective process is illustrated as process 304 in the process flow 300 as shown in FIG. 10. Encapsulant 26 may include a molding compound, an epoxy, a resin, and/or the like. Next, as shown in FIG. 8D, a planarization process such as a Chemical Mechanical Polish (CMP) process or a mechanical grinding process is performed, so that electrical connectors 22 in device die 20 are exposed. The respective process is illustrated as process 306 in the process flow 300 as shown in FIG. 10.

Figure 8E:
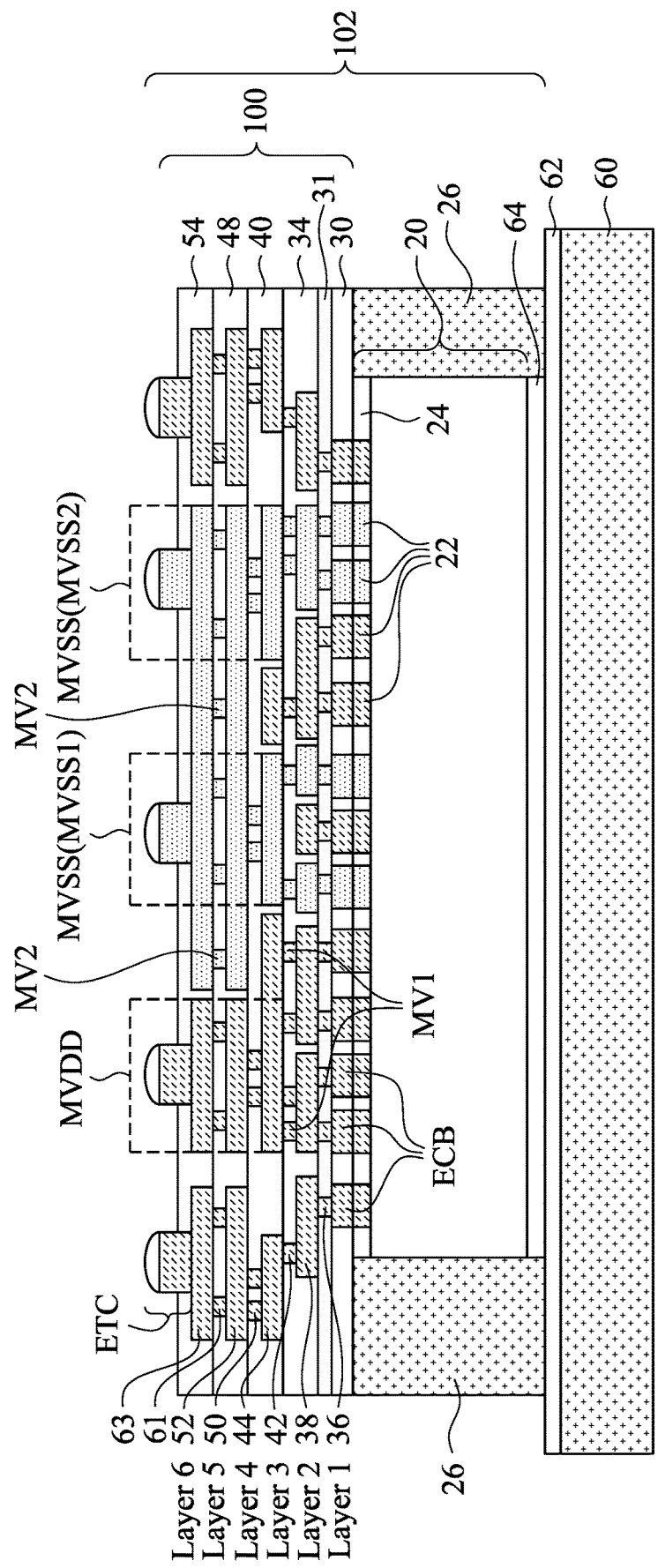

Referring to FIG. 8E, redistribution structure 100 is formed over device die 20 and encapsulant 26. The respective process is illustrated as process 308 in the process flow 300 as shown in FIG. 10. Integrated fan-out package 102 is thus formed. The dielectric layers 30, 31, 34, 40, 48, and 54 may be formed of organic materials, which may be polymers such as PBO, polyimide, BCB, or the like. Alternatively, the dielectric layers 30, 31, 34, 40, 48, and 54 may be formed of inorganic materials such as $SiO_2$, SiN, SiOC, SiOCN, SiON, or the like. The redistribution lines and vias ETB, 36, 38, 42, 44, 50, 52, 61, and 63 may be formed of copper or a copper alloy, and may include other materials such as Ti, TiN, Ta, TaN, nickel, or the like. The formation process may include plating. Metal lines 38, 44, 52, and 62 may be formed in the same plating processes as the corresponding underlying vias 36, 42, 50, and 60, and hence there may not be distinguishable interfaces in between. In accordance with some embodiments, the formation of electric connectors ECB and the redistribution lines may include depositing a metal seed layer, forming a patterned plating mask (not shown) over the metal seed layer, plating electrical connectors ECB in the openings in the plating mask and on the exposed portions of the metal seed layer, removing the plating mask, and etching the metal seed layer previously covered by the plated features. ETCs may also include metal pillars and solder regions. The layout of redistribution structure 100 is as discussed referring to preceding embodiments. The metal layers 1-6 are also marked. The features in the metal layers may be corresponding to the corresponding features in FIGS. 5A and 5B. For example, electrical connectors ECB and ETC have the patterns of electrical connectors ECB and ECT, respectively, in FIG. 5A.

The integrated fan-out package 102 is then de-bonded from carrier 60. The respective process is illustrated as process 310 in the process flow 300 as shown in FIG. 10. In accordance with some embodiments, the de-bonding process is performed by projecting a laser beam on LTHC 62, so that LTHC 62 is decomposed under the heat of the laser beam, and integrated fan-out package 102 may be lifted off from carrier 60. A grinding process may be performed on the backside of device die 20, so that die-attach film 64 is removed. The resulting structure is shown in FIG. 8A.

In the above-discussion of the formation of redistribution structure 100, redistribution structure 100 is formed directly over device die 20 and encapsulant 26 layer-by-layer. In accordance with other embodiments, redistribution structure 100 may also be formed separately, and then bonded to device die 20 or another type of package component such as a package, an interposer, a package substrate, a printed circuit board, or the like.

In the formed structure such as what is shown in FIG. 8A, PG macros MVDD and MVSS are formed in redistribution structure 100. In accordance with some embodiments, no redundant vias are formed inside PG macros MVDD and MVSS. Accordingly, a plurality of PG macros MVDD and MVSS (such as MVSS1 and MVSS2 in FIG. 8A) may be identical to each other in structures, sizes, shapes, and the like. These PG macros MVDD and MVSS may thus be identified for their identical structures that expand into a plurality of metal layers. It is also noted that the PG macros MVDD and MVSS in one or more the metal layers may be parts of the continuous metal plate without distinguishable interfaces therebetween.

The embodiments of the present disclosure have some advantageous features. By designing PG macros that extend into upper layers of the redistribution structures, and leaving the lower layers of the redistribution structures for laying out other features, it is free to use the chip areas directly underlying the PG macros and in the lower layers for designing. This provides flexibility in the design because the chip areas are not tied to the PG macros. This chip area may be used for laying out features tied to other electrical potential other than the overlying PG macros, or may be used for routing signals. Also, redundant vias are formed to reduce the resistance of the power paths. Shortest-path scheme is also adopted to reduce the resistance of the power paths. The shortest-path scheme may be used in the layers directly underlying the PG macros, and may extend into the upper layers in which PG macros are located, so that both design flexibility and reduced resistance can be achieved.

In accordance with some embodiments of the present disclosure, a structure comprises a device die; an encapsulant encapsulating the device die therein; a redistribution structure over and electrically connected to the device die, wherein the redistribution structure comprises a bottom layer and a plurality of upper layers over the bottom layer, and wherein the redistribution structure comprises a first power-ground macro extending from a topmost layer in the plurality of upper layers to a bottommost layer in the plurality of upper layers; a second power-ground macro extending from the topmost layer in the plurality of upper layers to the bottommost layer in the plurality of upper layers; at least one first conductive feature in the bottom layer and overlapped by the first power-ground macro; and at least one second conductive feature in the bottom layer and overlapped by the second power-ground macro, wherein patterns of the at least one first conductive feature are different from the at least one second conductive feature. In an embodiment, the at least one first conductive feature comprises a first plurality of conductive features, the at least one second conductive feature comprises a second plurality of conductive features, and a first total count of the first plurality of conductive features is different from a second total count of the second plurality of conductive features. In an embodiment, the at least one first conductive feature comprises a first metal pad electrically disconnected from the first power-ground macro. In an embodiment, the topmost layer comprises a solder region. In an embodiment, the bottom layer is in contact with a metal pad in the device die. In an embodiment, both of the first power-ground macro and the second power-ground macro are VDD macros. In an embodiment, both of the first power-ground macro and the second power-ground macro are VSS macros. In an embodiment, the first power-ground macro comprises a plurality of metal plates, each in one of the plurality of upper layers, and a plurality of vias in each of the plurality of upper layers, and wherein the plurality of metal plates in the first power-ground macro have identical patterns, locations, and sizes as corresponding ones of the plurality of metal plates in the second power-ground macro. In an embodiment, the first power-ground macro comprises a plurality of metal plates, and edges of the plurality of metal plates are vertically aligned. In an embodiment, the redistribution structure further comprises an additional layer over the bottom layer and under the plurality of upper layers, and wherein the redistribution structure further comprises a metal pad in the additional layer, and the metal pad is overlapped by, and is electrically disconnected from, the first power-ground macro.

In accordance with some embodiments of the present disclosure, a structure includes a redistribution structure comprising a bottom layer and a plurality of upper layers over the bottom layer, wherein the redistribution structure comprises a first power-ground macro extending from a topmost layer in the plurality of upper layers to a bottommost layer in the plurality of upper layers; and a first metal pad in the bottom layer and overlapped by the first power-ground macro, wherein the first metal pad is electrically disconnected from the first power-ground macro. In an embodiment, the structure further comprises a second metal pad in the bottom layer and overlapped by the first power-ground macro, wherein the second metal pad is electrically connected to the first power-ground macro. In an embodiment, the structure further comprises a device die overlapped by the first power-ground macro, wherein the device die further comprises a second metal pad physically bonding to the first metal pad. In an embodiment, the structure further comprises a second power-ground macro extending from the topmost layer in the plurality of upper layers to the bottommost layer in the plurality of upper layers, wherein the second power-ground macro is identical to the first power-ground macro; and a second metal pad in the bottom layer and overlapped by the second power-ground macro, wherein the second metal pad is electrically connected to the second power-ground macro. In an embodiment, a first total number of metal pads in the bottom layer and overlapped by the first power-ground macro is different from a second total number of metal pads in the bottom layer and overlapped by the second power-ground macro.

In accordance with some embodiments of the present disclosure, a method includes placing a device die over a carrier; encapsulating the device die in an encapsulant; planarizing the encapsulant to reveal metal pads in the device die; and forming a redistribution structure over the device die and the encapsulant, wherein the redistribution structure comprises a bottom layer in contact with the device die, and a plurality of upper layers over the bottom layer, and wherein the redistribution structure comprises a first power-ground macro extending from a topmost layer in the plurality of upper layers to a bottommost layer in the plurality of upper layers; and a first metal pad in the bottom layer and overlapped by the first power-ground macro, wherein the first metal pad is electrically disconnected from the first power-ground macro. In an embodiment, the redistribution structure further comprises a second power-ground macro extending from the topmost layer in the plurality of upper layers to the bottommost layer in the plurality of upper layers; and a second metal pad in the bottom layer and overlapped by the second power-ground macro, wherein the second metal pad is electrically connected to the second power-ground macro. In an embodiment, the forming the first power-ground macro comprises forming a solder region in the topmost layer in the plurality of upper layers. In an embodiment, the method further comprises de-bonding the carrier from the device die and the encapsulant. In an embodiment, the plurality of upper layers comprise four layers.

In accordance with some embodiments of the present disclosure, a method comprises placing a plurality of power-ground macros into a layout of a redistribution structure, wherein the redistribution structure comprises a plurality of upper layers, wherein the plurality of power-ground macros extend into the plurality of upper layers; and a first lower layer under the plurality of upper layers; laying out a metal plate in the first lower layer, wherein the metal plate extends directly under the plurality of power-ground macros; patterning the metal plate to form patterns of a plurality metal features; and laying out patterns of metal vias connecting the plurality of power-ground macros with the plurality metal features that are directly under the plurality of power-ground macros. In an embodiment, the method further comprises manufacturing a physical package component implementing the layout of the redistribution structure. In an embodiment, the power-ground macros are copied from a cell library. In an embodiment, the placing the plurality of power-ground macros comprise placing a VDD macro and a VSS macro, wherein the VDD macro and the VSS macro have an identical structure. In an embodiment, the method further comprises laying out a bottom electrical connector in a second lower layer underlying the first lower layer, wherein the bottom electrical connector is overlapped by a first macro in the plurality of power-ground macros, and the bottom electrical connector is electrically connected to a second macro in the plurality of power-ground macros. In an embodiment, the first macro is a VDD macro, and the second macro is a VSS macro. In an embodiment, the method further comprises laying out a top electrical connector in the layout of the redistribution structure; laying out a bottom electrical connector in the layout of the redistribution structure; and laying out a plurality of metal lines and vias to electrically connect the bottom electrical connector with the top electrical connector, wherein the plurality of metal lines and vias are laid out using a shortest-path scheme. In an embodiment, the method further comprises laying out redundant vias to further connect the plurality of power-ground macros with the plurality metal features that are directly under the plurality of power-ground macros. In an embodiment, the method further comprises laying out redundant vias inside the plurality of power-ground macros.

In accordance with some embodiments of the present disclosure, a method comprises placing a first power-ground macro into a layout of a redistribution structure, wherein the first power-ground macro extends into a plurality of upper layers of the redistribution structure; laying out a bottom electrical connector directly underlying the first power-ground macro; forming a pattern of a metal feature over the bottom electrical connector and underlying the first power-ground macro; laying out a first pattern of a first via connecting the bottom electrical connector to the pattern of the metal feature; and laying out a second pattern of a second via connecting the pattern of the metal feature to the first power-ground macro. In an embodiment, the forming the pattern of the metal feature comprises laying out a continuous metal plate extending laterally beyond edges of the first power-ground macro; and patterning the continuous metal plate to form the pattern of the metal feature. In an embodiment, the patterning the continuous metal plate forms the pattern of the metal feature and an additional pattern of an additional metal feature, wherein the pattern of the additional metal feature is encircled by the pattern of the metal feature. In an embodiment, the first power-ground macro is a VDD macro, and the method further comprises placing a second power-ground macro into the layout of the redistribution structure, wherein the pattern of the additional metal feature is directly underlying the second power-ground macro, and the second power-ground macro is a VSS macro; and laying out a third pattern of a third via connecting the pattern of the additional metal feature to the second power-ground macro. In an embodiment, the method further comprises placing a plurality of power-ground macros into the layout of the redistribution structure, wherein each of the plurality of power-ground macros is limited in the plurality of upper layers. In an embodiment, the method further comprises laying out a metal plate in one of the plurality of upper layers, wherein the metal plate joins a plurality power-ground macros to the power-ground macro.

In accordance with some embodiments of the present disclosure, a method comprises providing a layout of a redistribution structure, wherein the redistribution structure comprises a plurality of upper layers and a lower layer underlying the upper layers; placing a plurality of power macros and a plurality of ground macros, wherein bottom parts of the plurality of power macros and the plurality of ground macros are in a bottom layer in the plurality of upper layers; laying out patterns of a plurality of conductive features, wherein the patterns of the plurality of conductive features are overlapped by the plurality of power macros and the plurality of ground macros; and laying out vias connecting the plurality of conductive features to the plurality of power macros and the plurality of ground macros. In an embodiment, each of the plurality of power macros and the plurality of ground macros comprises a top connector layer and at least two metal layers under the top connector layer. In an embodiment, the layout of the redistribution structure is a part of a fan-out package. In an embodiment, the method further comprises manufacturing a package, with the layout of the redistribution structure being implemented in the package. In an embodiment, the plurality of power macros and the plurality of ground macros are copied from a cell library.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing a device die over a carrier;
   encapsulating the device die in an encapsulant;
   planarizing the encapsulant to reveal metal pads in the device die; and
   forming a redistribution structure over the device die and the encapsulant, wherein the redistribution structure comprises a bottom layer in contact with the device die, and a plurality of upper layers over the bottom layer, and wherein the redistribution structure comprises:
   a first power-ground macro extending from a topmost layer in the plurality of upper layers to a bottommost layer in the plurality of upper layers; and
   a first metal pad in the bottom layer and overlapped by the first power-ground macro, wherein the first metal pad is electrically disconnected from the first power-ground macro.

2. The method of claim 1, wherein the redistribution structure further comprises:
   a second power-ground macro extending from the topmost layer in the plurality of upper layers to the bottommost layer in the plurality of upper layers; and a second metal pad in the bottom layer and overlapped by the second power-ground macro, wherein the second metal pad is electrically connected to the second power-ground macro.

3. The method of claim 1, wherein the forming the first power-ground macro comprises forming a solder region in the topmost layer in the plurality of upper layers.

4. The method of claim 1 further comprising de-bonding the carrier from the device die and the encapsulant.

5. The method of claim 1, wherein the plurality of upper layers comprise four layers.

6. The method of claim 1 further comprising:
before the redistribution structure is formed, copying the first power-ground macro from a library and placing the first power-ground macro into a design layout; and
laying out the first metal pad in the design layout, wherein the redistribution structure is formed to implement the design layout.

7. The method of claim 6, wherein the placing the first power-ground macro and the laying out the first metal pad are performed in separate steps.

8. The method of claim 6 further comprising:
placing a plurality of power macros and a plurality of ground macros into the design layout;
laying out a blanket metal pad overlapped by the plurality of power macros and the plurality of ground macros; and
patterning the blanket metal pad in the design layout as a first plurality of metal plates and a second plurality of metal plates separated from each other.

9. The method of claim 8, wherein one of the first plurality of metal plates encircles the second plurality of metal plates.

10. The method of claim 9 further comprising
laying out a first via in the design layout and connecting the one of the first plurality of metal plates to one of the power macros; and
laying out a plurality of second vias in the design layout and connecting the second plurality of metal plates to respective ones of the plurality of ground macros.

11. The method of claim 8, wherein the blanket metal pad is in a layer higher than the first metal pad.

12. A method comprising:
placing a device die over a carrier;
encapsulating the device die in an encapsulant;
planarizing the encapsulant to reveal metal pads in the device die; and
forming a redistribution structure over the device die and the encapsulant, wherein forming the redistribution structure comprises:
forming a plurality of dielectric layers and a plurality of conductive layers in the plurality of dielectric layers, wherein the forming the plurality of conductive layers comprises:
forming a bottom layer of conductive features, wherein the bottom layer comprises:
at least one first conductive feature; and
at least one second conductive feature, wherein patterns of the at least one first conductive feature are different from the at least one second conductive feature;
forming a first power-ground macro overlapping the at least one first conductive feature; and
forming a second power-ground macro overlapping the at least one second conductive feature.

13. The method of claim 12 further comprising:
copying and placing the first power-ground macro and the second power-ground macro from a library into a design layout; and
laying out the bottom layer of conductive features in the design layout, wherein the redistribution structure is formed to implement the design layout.

14. The method of claim 12, wherein the first power-ground macro and the second power-ground macro are identical to each other.

15. The method of claim 12, wherein the metal pads of the device die comprise metal pillars.

16. The method of claim 12, wherein the bottom layer of conductive features has a top surface level with a top surface of one of the plurality of dielectric layers.

17. A method comprising:
placing a device die over a carrier;
encapsulating the device die in an encapsulant;
planarizing the encapsulant to reveal metal pads in the device die; and
forming a redistribution structure over the device die and the encapsulant, wherein the redistribution structure comprises:
a plurality of lower dielectric layers over the device die;
a first metal pad in a bottom layer of the plurality of lower dielectric layers;
a plurality of upper dielectric layers over the plurality of lower dielectric layers; and
a power-ground macro extending from a topmost layer in the plurality of upper dielectric layers to a bottommost layer in the plurality of upper dielectric layers, wherein the first metal pad is overlapped by the power-ground macro, and wherein the first metal pad is electrically disconnected from the power-ground macro.

18. The method of claim 17, wherein the redistribution structure comprises:
a second metal pad in the bottom layer and vertically misaligned from the power-ground macro, wherein the second metal pad is electrically connected to the power-ground macro.

19. The method of claim 17, wherein the redistribution structure is formed layer-by-layer.

20. The method of claim 17 further comprising:
copying the power-ground macro from a library and placing the power-ground macro into a design layout; and
laying out the first metal pad in the design layout in a step that is separate from the copying and placing, wherein the redistribution structure is formed to implement the design layout.

* * * * *